US012677705B2

(12) United States Patent
Chou et al.

(10) Patent No.: US 12,677,705 B2
(45) Date of Patent: Jul. 7, 2026

(54) STRUCTURE AND FORMATION METHOD OF PACKAGE WITH INTEGRATED CHIPS

(71) Applicant: Taiwan Semiconductor Manufacturing Company, Ltd., Hsinchu (TW)

(72) Inventors: Chih-Chao Chou, Hsinchu City (TW); Yi-Hsun Chiu, Zhubei City (TW); Shang-Wen Chang, Jhubei City (TW); Ching-Wei Tsai, Hsinchu City (TW); Chih-Hao Wang, Baoshan Township, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 562 days.

(21) Appl. No.: 18/163,416

(22) Filed: Feb. 2, 2023

(65) Prior Publication Data

US 2024/0266340 A1 Aug. 8, 2024

(51) Int. Cl.
H10W 90/00 (2026.01)
H10W 20/41 (2026.01)
(Continued)

(52) U.S. Cl.
CPC ........... H10W 90/00 (2026.01); H10W 20/42 (2026.01); H10W 20/427 (2026.01); H10P 72/74 (2026.01); H10P 72/7416 (2026.01); H10P 72/743 (2026.01); H10P 72/744 (2026.01); H10W 72/252 (2026.01); H10W 72/941 (2026.01);
(Continued)

(58) Field of Classification Search
CPC . H01L 25/50; H01L 23/5226; H01L 23/5286; H01L 24/05; H01L 24/08; H01L 24/13; H01L 24/80; H01L 25/0652; H01L 25/0657; H01L 21/6835; H01L 25/18; H01L 2221/68327; H01L 2221/68359; H01L 2221/68381; H01L 2224/05571; H01L 2224/05624; H10W 90/00; H10W 20/42; H10W 20/427; H10W 72/252; H10W 72/941; H10W 72/951; H10W 80/312; H10W 80/327; H10W 90/792; H10W 20/481; H10W 72/944;
(Continued)

(56) References Cited

U.S. PATENT DOCUMENTS

| | | | |
|---|---|---|---|
| 8,993,380 B2 | 3/2015 | Hou et al. |
| 9,281,254 B2 | 3/2016 | Yu et al. |

(Continued)

*Primary Examiner* — Thanh Y. Tran
(74) *Attorney, Agent, or Firm* — McClure, Qualey & Rodack, LLP

(57) ABSTRACT

A package structure and a formation method are provided. The method includes disposing a first chip structure over a carrier substrate. The first chip structure has a front-side interconnection structure facing the carrier substrate. The method also includes forming a back-side interconnection structure over the first chip structure. The first chip structure has a device portion between the back-side interconnection structure and the front-side interconnection structure. The back-side interconnection structure has stacked conductive vias. The method further includes bonding a second chip structure to the first chip structure using dielectric-to-dielectric bonding and metal-to-metal bonding.

20 Claims, 25 Drawing Sheets

(51) Int. Cl.

| | |
|---|---|
| *H10W 20/42* | (2026.01) |
| *H10P 72/70* | (2026.01) |
| *H10W 72/20* | (2026.01) |
| *H10W 72/90* | (2026.01) |
| *H10W 80/00* | (2026.01) |

(52) U.S. Cl.
CPC ...... *H10W 72/9415* (2026.01); *H10W 72/951* (2026.01); *H10W 72/952* (2026.01); *H10W 80/211* (2026.01); *H10W 80/312* (2026.01); *H10W 80/327* (2026.01); *H10W 90/792* (2026.01)

(58) Field of Classification Search
CPC .... H10P 72/74; H10P 72/7416; H10P 72/743; H10P 72/744
See application file for complete search history.

(56) References Cited

U.S. PATENT DOCUMENTS

| | | | |
|---|---|---|---|
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2020/0343218 A1* | 10/2020 | Hu | H01L 24/80 |
| 2023/0113465 A1* | 4/2023 | Kim | H01L 24/80 257/777 |
| 2024/0153894 A1* | 5/2024 | Knickerbocker | H01L 24/80 |
| 2024/0206193 A1* | 6/2024 | Wang | H01L 24/80 |

* cited by examiner

STRUCTURE AND FORMATION METHOD OF PACKAGE WITH INTEGRATED CHIPS

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature sizes (i.e., the smallest component that can be created using a fabrication process) have decreased. This scaling-down process generally provides benefits by increasing production efficiency and lowering associated costs.

A chip package not only provides protection for semiconductor devices from environmental contaminants, but also provides a connection interface for the semiconductor devices packaged therein. Smaller package structures, which take up less space or are lower in height, have been developed to package the semiconductor devices.

New packaging technologies have been developed to further improve the density and functionality of semiconductor dies. These relatively new types of packaging technologies for semiconductor dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
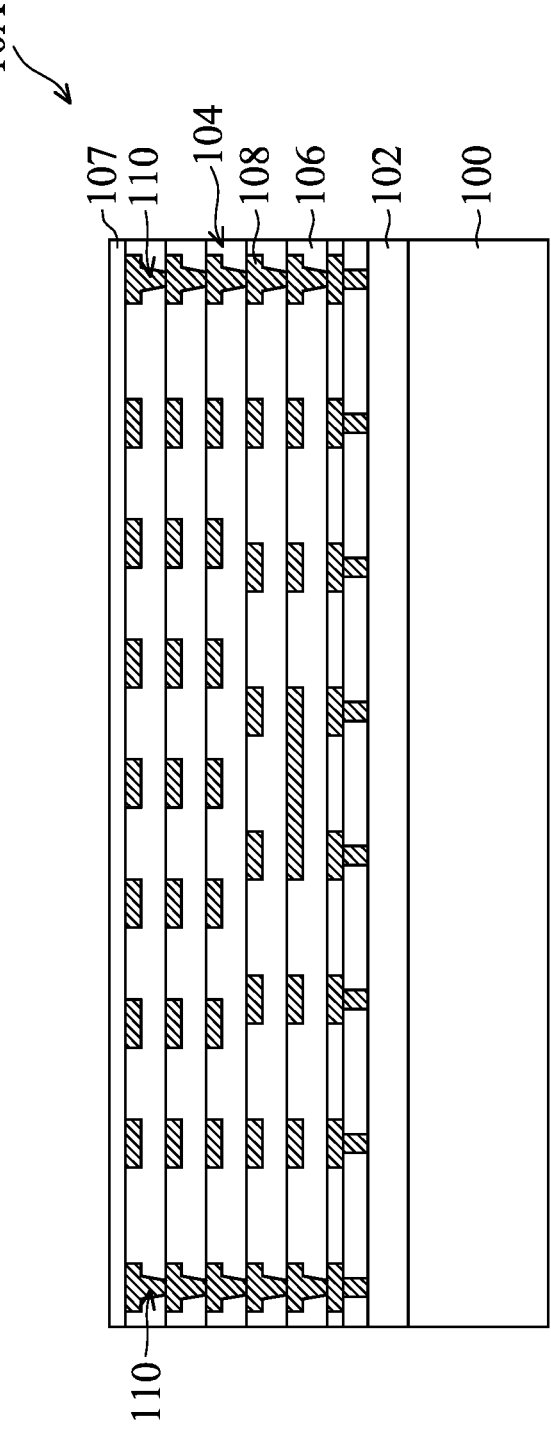
FIGS. 1A-1I are cross-sectional views of various stages of a process for forming a package structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure may relate to package structures such as three-dimensional (3D) packaging, 3D-IC devices, and 2.5D packaging. Embodiments of the disclosure form a package structure including a substrate that carries one or more dies or packages and a protective element (such as a protective lid) aside the dies or packages. The protective element may also function as a warpage-control element and/or heat dissipation element.

Other features and processes may also be included. For example, testing structures may be included to aid in the verification testing of the 3D packaging, 3DIC devices, and/or 2.5 D packaging. The testing structures may include, for example, test pads formed in a redistribution layer or on a substrate that allows testing to be conducted using probes or probe cards and the like. Verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1I are cross-sectional views of various stages of a process for forming a package structure, in accordance with some embodiments. As shown in FIG. 1A, a chip structure (or a chip-containing structure) 10A is received or formed, in accordance with some embodiments. In some embodiments, the chip structure 10A is a semiconductor wafer.

As shown in FIG. 1A, the chip structure 10A includes a semiconductor substrate 100. In some embodiments, the chip structure 10A includes a device portion 102. Multiple device elements are formed in and/or on the device portion 102. Examples of the various device elements include transistors (e.g., metal oxide semiconductor field effect transistors (MOSFET), complementary metal oxide semiconductor (CMOS) transistors, bipolar junction transistors (BJT), or other suitable elements. Multiple isolation features may be formed in the device portion 102 to electrically isolate the device elements. Various processes may be used to form the various device elements, including deposition, etching, implantation, photolithography, annealing, and/or other suitable processes.

In some embodiments, a front-side interconnection structure 104 is formed on the device portion 102 for providing electrical connections to the device elements. The front-side interconnection structure 104 includes multiple conductive features 108 that are surrounded by multiple dielectric layers 106.

The dielectric layers 106 may be made of or include silicon oxide, carbon-containing silicon oxide, silicon oxynitride, another suitable material, or a combination thereof. The conductive features 108 may be made of or include copper, cobalt, aluminum, tungsten, nickel, gold, another suitable material, or a combination thereof. In some embodiments, one or more barrier layers are formed between the dielectric layers 106 and the conductive features 108. The barrier layers may be made of or include titanium nitride, tantalum nitride, another suitable material, or a combination thereof.

The conductive features 108 may include conductive contacts, conductive lines, and conductive vias. The conductive contacts may be used to form electrical connection to the gate features, the source features and/or the drain features formed in the device portion 102. The device elements in the device portion 102 of the chip structure 10A may be interconnected by the front-side interconnection structure 104 to form integrated circuit devices.

In some embodiments, the front-side interconnection structure 104 includes multiple via tower structures 110, as shown in FIG. 1A. Each of the via tower structures 110 includes some of the conductive features 108. Each of the via tower structures 110 includes a stack of conductive vias. Each of the stacked conductive vias may be used to form electrical connection between an overlying conductive line and an underlying conductive line. Each of the via tower structures 110 may have a height that is in a range from about 5 μm to about 10 μm. Multiple single damascene processes and/or multiple dual damascene processes may be used to form the via tower structures 110. The formation of the front-side interconnection structure 104 that includes the via tower structures 110 may involve multiple deposition processes, multiple patterning processes, and multiple planarization processes.

In some embodiments, the front-side interconnection structure 104 also includes a protective layer 107, as shown in FIG. 1A. The protective layer 107 may be used to protect the conductive features 108 thereunder during the subsequent processes. The protective layer 107 may be made of or include silicon nitride, silicon oxide, silicon oxynitride, another suitable material, or a combination thereof. The protective layer 107 may be formed using a chemical vapor deposition (CVD) process, a physical vapor deposition (PVD) process, an atomic layer deposition (ALD) process, another applicable process, or a combination thereof.

Figure 1B:
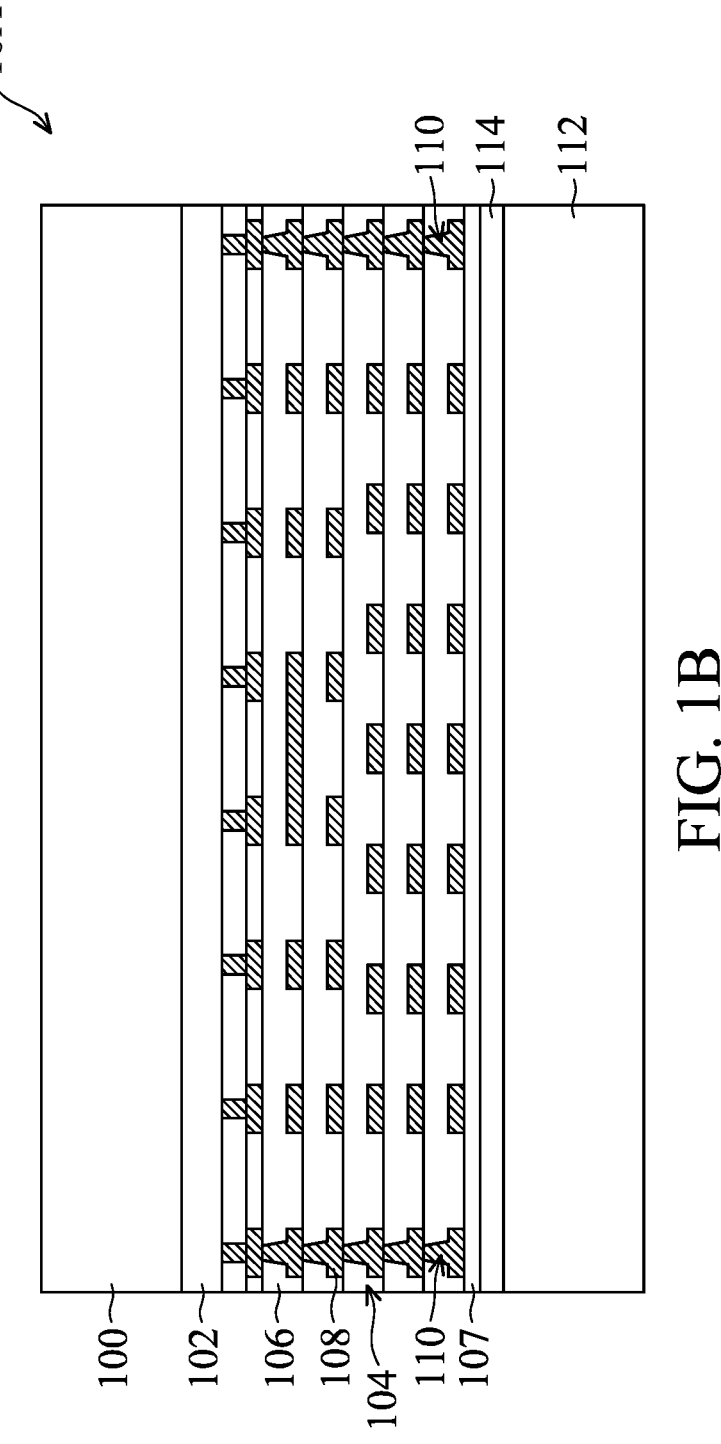

As shown in FIG. 1B, the chip structure 10A is turned upside down and attached to a carrier substrate 112 through an adhesive film 114, in accordance with some embodiments. The carrier substrate 112 may be a carrier wafer. The carrier wafer may include a semiconductor wafer (such as a silicon wafer), a dielectric wafer (such as a glass wafer), or the like.

Figure 1C:
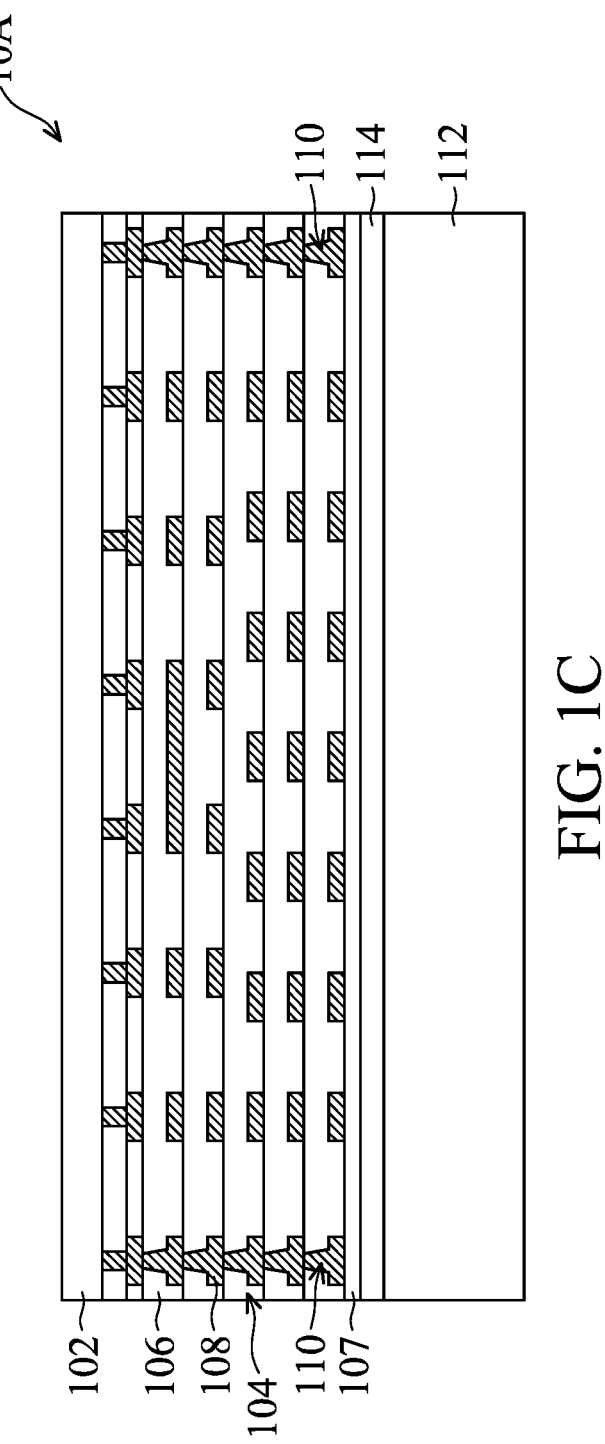

As shown in FIG. 1C, the chip structure 10A is thinned, in accordance with some embodiments. In some embodiments, the semiconductor substrate 100 is removed. In some other embodiments, the semiconductor substrate 100 is partially removed. In some embodiments, the device portion 102 is exposed. In some embodiments, the isolation features and some device elements formed in the device portion 102 are exposed. The exposed device elements may include conductive features that are electrically connected to the drain features formed in the device portion 102.

The chip structure 10A may be thinned using an applicable planarization process. The planarization process may include a chemical mechanical polishing (CMP) process, a grinding process, an etching process, another applicable process, or a combination thereof.

Figure 1D:
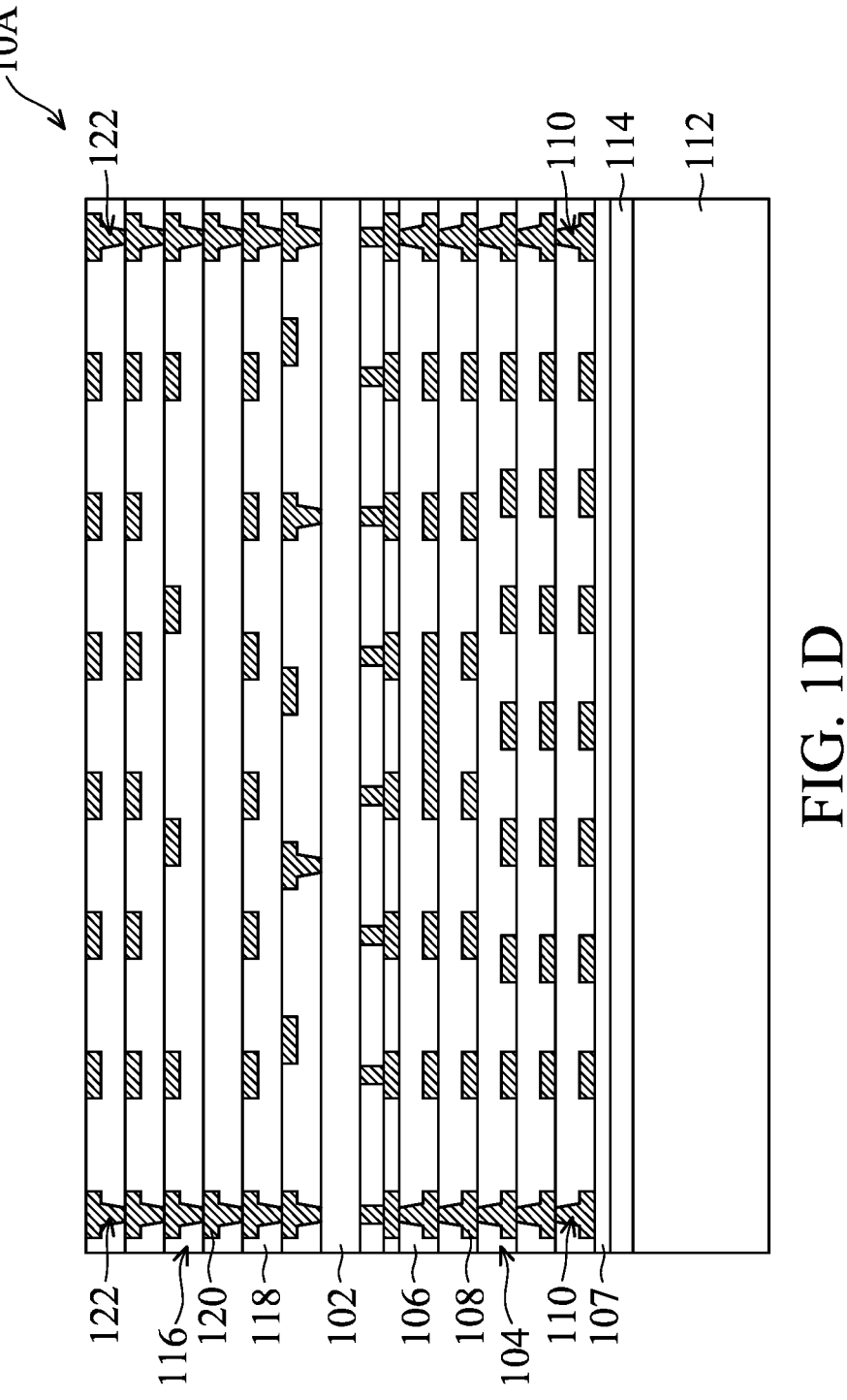

As shown in FIG. 1D, a back-side interconnection structure 116 is formed on the device portion 102 for providing electrical connections to the device elements. In some embodiments, the back-side interconnection structure 116 is used to provide electrical connection to the drain features formed in the device portion 102. In some embodiments, the back-side interconnection structure 116 includes multiple backside power rails.

The back-side interconnection structure 116 includes multiple conductive features 120 that are surrounded by multiple dielectric layers 118. The conductive features 120 may include conductive contacts, conductive lines, and conductive vias. The conductive contacts may be used to form electrical connection to the drain features formed in the device portion 102.

The dielectric layers 118 may be made of or include silicon oxide, carbon-containing silicon oxide, silicon oxynitride, another suitable material, or a combination thereof. The conductive features 120 may be made of or include copper, cobalt, aluminum, tungsten, nickel, gold, another suitable material, or a combination thereof. In some embodiments, one or more barrier layers are formed between the dielectric layers 118 and the conductive features 120. The barrier layers may be made of or include titanium nitride, tantalum nitride, another suitable material, or a combination thereof.

In some embodiments, the back-side interconnection structure 116 includes multiple via tower structures 122, as shown in FIG. 1D. Each of the via tower structures 122 includes some of the conductive features 120. Each of the via tower structures 122 includes a stack of conductive vias. Each of the conductive vias may be used to form electrical connection between an overlying conductive line and an underlying conductive line. In some embodiments, the via tower structures 122 function as backside power rails that are electrically connected to the device portion 102 of the chip structure 10A. For example, each of the via tower structures 122 is electrically connected to the corresponding drain feature formed in the device portion 102. Each of the via tower structures 122 may have a height that is in a range from about 5 μm to about 10 μm.

Multiple single damascene processes and/or multiple dual damascene processes may be used to form the via tower structures 122. The formation of the back-side interconnection structure 116 that includes the via tower structures 122 may involve multiple deposition processes, multiple patterning processes, and multiple planarization processes.

Figure 1E:
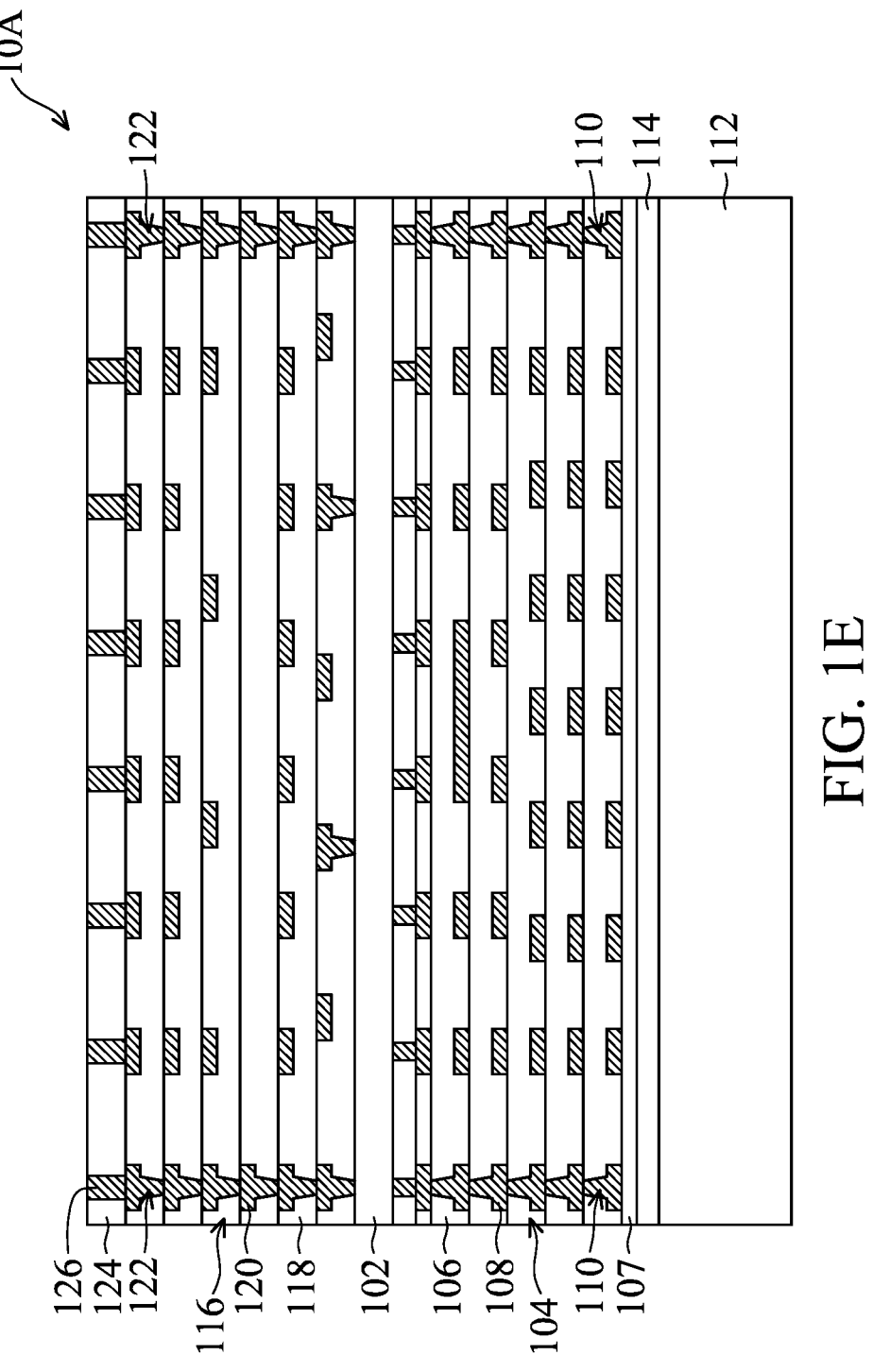

As shown in FIG. 1E, a dielectric layer 124 and multiple conductive features 126 are formed over the top surfaces of the dielectric layers 118 and the conductive features 120, in accordance with some embodiments. As a result, the back-side interconnection structure 116 further includes the dielectric layer 124 and the conductive features 126. The dielectric layer 124 and the conductive features 126 may function as bonding structures.

The dielectric layer 124 may be made of or include silicon oxide, carbon-containing silicon oxide, silicon oxynitride, carbon-containing silicon oxynitride, one or more other suitable materials, or a combination thereof. The dielectric layer 124 may be deposited using a CVD process, an ALD process, another applicable process, or a combination thereof.

Afterwards, one or more photolithography processes and one or more etching processes are used to partially remove the dielectric layer 124. As a result, multiple openings that are used to contain conductive features are formed in the dielectric layer 124. One or more conductive materials are then deposited over the dielectric layer 124 to overfill these openings. A planarization process is then used to remove the portions of the conductive materials that are outside of the openings. As a result, the remaining portions of the conductive materials form the conductive features 126, as shown in FIG. 1E.

The conductive materials may be made of or include copper, aluminum, cobalt, tungsten, nickel, gold, platinum, one or more other suitable materials, or a combination thereof. The conductive materials may be deposited using a CVD process, an electroplating process, an electrochemical plating process, an ALD process, a PVD process, another applicable process, or a combination thereof. The planarization process may include a CMP process, a grinding process, a dry polishing process, an etching process, another applicable process, or a combination thereof. The planarization process may be used to provide a highly planarized bonding surface of the chip structure 10A.

Figure 1F:
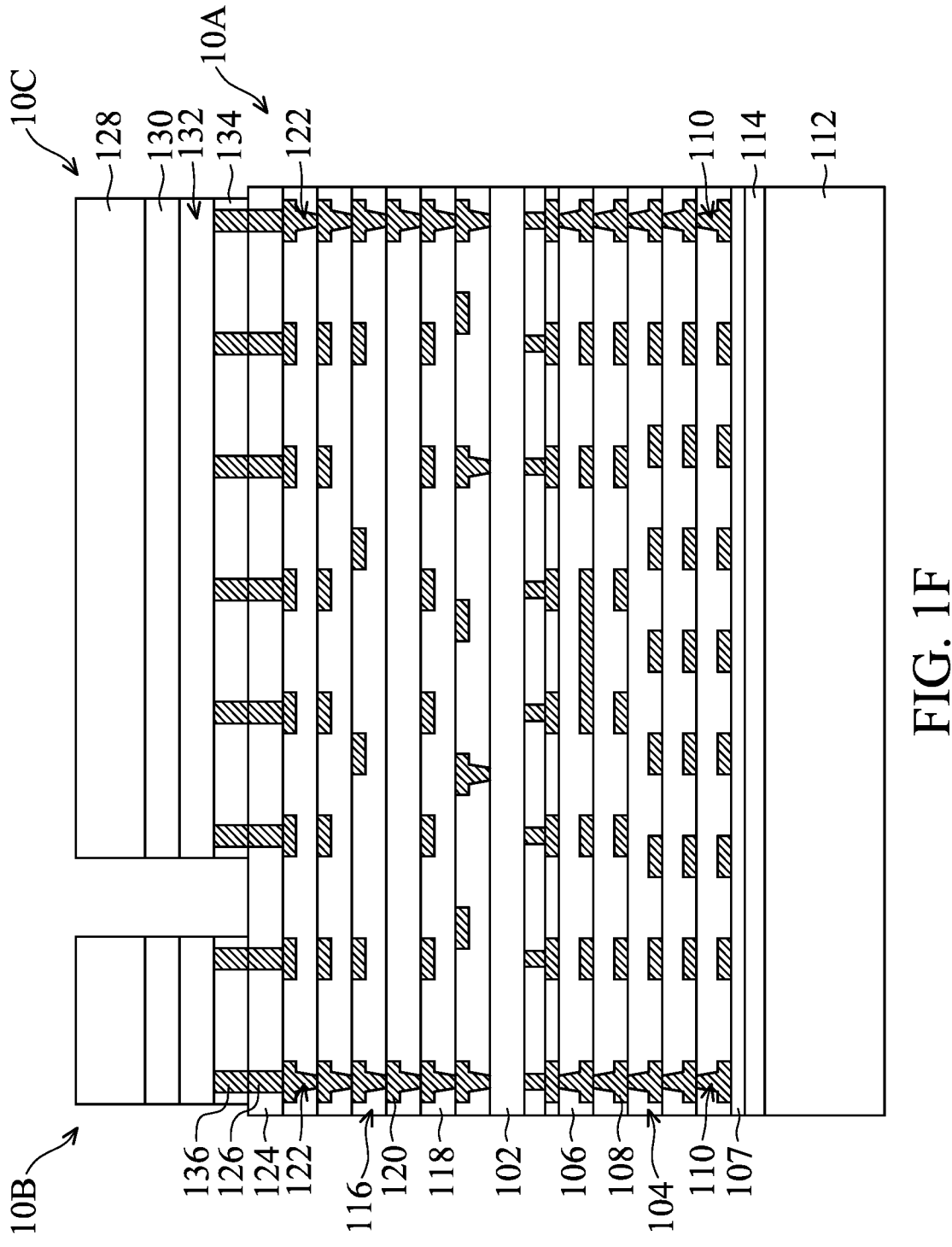

As shown in FIG. 1F, chip structures 10B and 10C are bonded to the chip structure 10A, in accordance with some embodiments. In some embodiments, each of the chip structures 10B and 10C is a known good chip. In some embodiments, the chip structure 10A is formed using a more advanced technology node than the chip structure 10B or 10C. In some embodiments, the average gate width of the transistors formed in the chip structure 10A is smaller than the average gate width of the transistors formed in the chip structure 10B or 10C.

In some embodiments, each of the chip structures 10B and 10C includes a semiconductor substrate 128. In some embodiments, each of the chip structures 10B and 10C includes a device portion 130. Multiple device elements are formed in and/or on the device portion 130. Examples of the various device elements include transistors (e.g., metal oxide semiconductor field effect transistors (MOSFET), complementary metal oxide semiconductor (CMOS) transistors, bipolar junction transistors (BJT), or other suitable elements. Multiple isolation features may be formed in the device portion 130 to electrically isolate the device elements. Various processes may be used to form the various device elements, including deposition, etching, implantation, photolithography, annealing, and/or other suitable processes.

In some embodiments, a front-side interconnection structure 132 is formed on the device portion 130 for providing electrical connections to the device elements. Similar to the front-side interconnection structure 104 of the chip structure 10A, the front-side interconnection structure 132 includes multiple conductive features and multiple dielectric layers.

In some embodiments, a dielectric layer 134 and multiple conductive features 136 are also formed. The front-side interconnection structure 132 thus further includes the dielectric layer 134 and the conductive features 136. The dielectric layer 134 and the conductive features 136 may function as bonding structures.

The dielectric layer 134 may be made of or include silicon oxide, carbon-containing silicon oxide, silicon oxynitride, carbon-containing silicon oxynitride, one or more other suitable materials, or a combination thereof. The dielectric layer 134 may be deposited using a CVD process, an ALD process, another applicable process, or a combination thereof.

Afterwards, one or more photolithography processes and one or more etching processes are used to partially remove the dielectric layer 134. As a result, multiple openings that are used to contain conductive features are formed in the dielectric layer 134. One or more conductive materials are then deposited over the dielectric layer 134 to overfill these openings. A planarization process is then used to remove the portions of the conductive materials that are outside of the openings. As a result, the remaining portions of the conductive materials form the conductive features 136, as shown in FIG. 1F.

The conductive materials may be made of or include copper, aluminum, cobalt, tungsten, nickel, gold, platinum, one or more other suitable materials, or a combination thereof. The conductive materials may be deposited using a CVD process, an electroplating process, an electrochemical plating process, an ALD process, a PVD process, another applicable process, or a combination thereof. The planarization process may include a CMP process, a grinding process, a dry polishing process, an etching process, another applicable process, or a combination thereof. Due to the planarization process, each of the chip structures 10B and 10C may have a highly planarized bonding surface.

As shown in FIG. 1F, the chip structures 10B and 10C are bonded to the chip structure 10A through direct bonding, in accordance with some embodiments. The direct bonding may be achieved using a hybrid bonding, a fusion bonding, or the like. The hybrid bonding may include metal-to-metal bonding such as the bonding between the conductive features 126 and 136 and dielectric-to-dielectric bonding such as the bonding between the dielectric layers 124 and 134. In some embodiments, there is no solder elements formed between the chip structures 10A and 10B. In some embodiments, there is no solder elements formed between the chip structures 10A and 10C. In some embodiments, the bottommost surfaces of the chip structures 10B and 10C are substantially level, as shown in FIG. 1F.

In some embodiments, the chip structures 10B and 10C are placed directly on the chip structure 10A. As a result, the dielectric layers 124 and 134 are in direct contact with each other and bonded to each other. The conductive features 126 and 136 are also in direct contact with each other.

As mentioned above, before the placing of the chip structures 10B and 10C, planarization processes are performed, so as to provide highly planarized bonding surfaces of the chip structures 10A, 10B, and 10C. In some embodiments, there is no gap between the dielectric layers 124 and 134. In some embodiments, there is no gap between the conductive features 126 and 136. In some embodiments, a thermal operation is then used to enhance the bonding between the conductive features 126 and 136. The temperature of the thermal operation may within a range from about 100 degrees C. to about 700 degrees C.

Figure 1G:
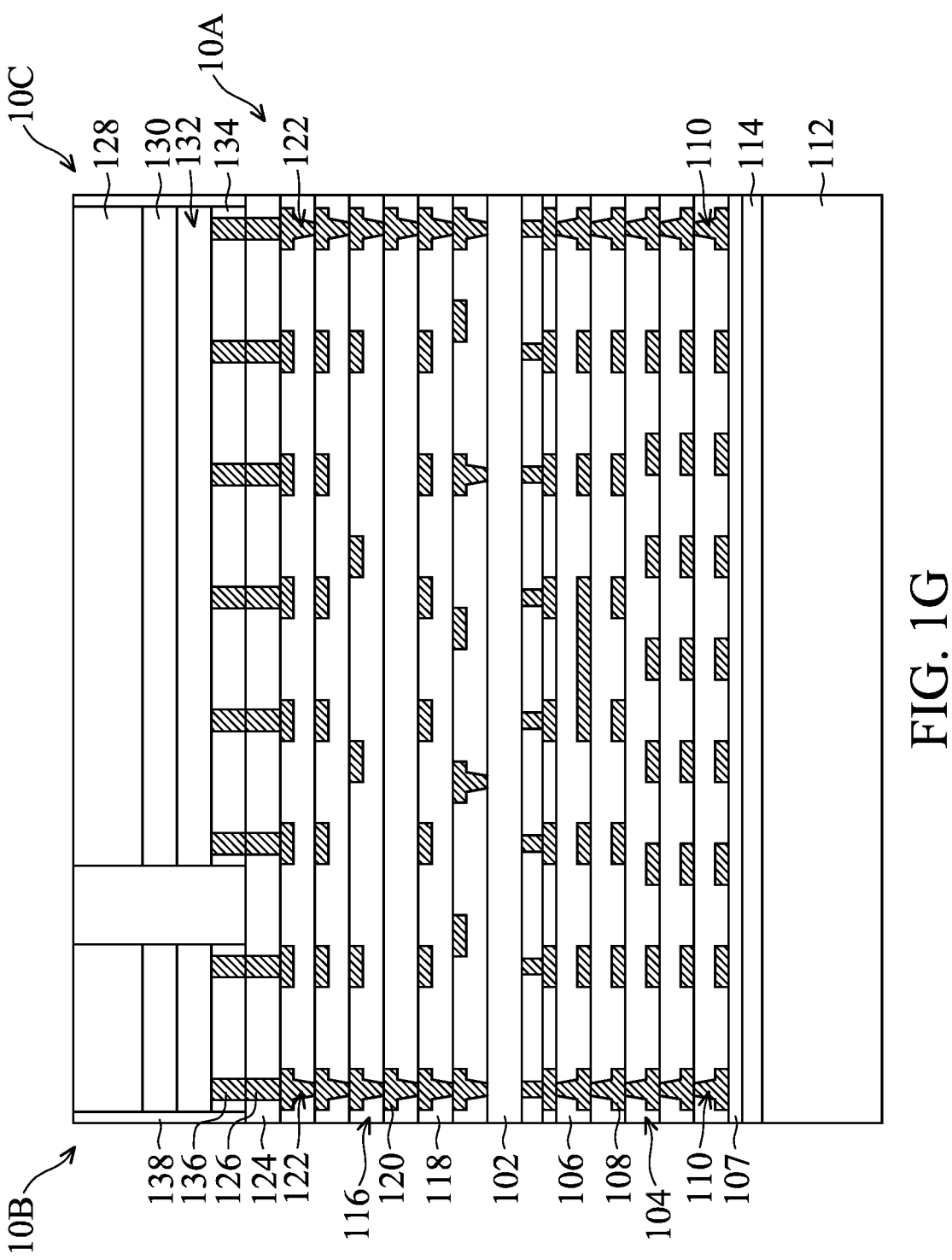

As shown in FIG. 1G, a protective layer 138 is formed over the chip structure 10A to laterally surround the chip structures 10B and 10C, in accordance with some embodiments. The protective layer 138 may be made of or include silicon oxide, silicon oxynitride, carbon-containing silicon oxide, carbon-containing silicon oxynitride, a molding material, another suitable material, or a combination thereof. The molding material may include an epoxy-based material dispersed with fillers such as silica fibers, carbon-containing fibers, or the like.

In some embodiments, a protective material layer is formed over the chip structures 10A-10C. The protective material layer may be formed using a CVD process, an ALD process, a molding process, another applicable process, or a combination thereof. Afterwards, a planarization process may be used to partially remove the protective material layer. As a result, the remaining portion of the protective material layer forms the protective layer 138, as shown in FIG. 1G. In some embodiments, the top surfaces of the protective layer 138 and the chip structures 10B and 10C are substantially level.

As shown in FIG. 1G, the top surfaces of the chip structures 10B and 10C are substantially level. However, embodiments of the disclosure are not limited thereto. Many variations and/or modifications can be made to embodiments of the disclosure. In some other embodiments, the chip structure 10B is taller than the chip structure 10C. In these cases, the protective layer 138 may cover the top surface of the chip structure 10C. The top surfaces of the protective layer 138 and the chip structure 10B may be substantially level.

Figure 1H:
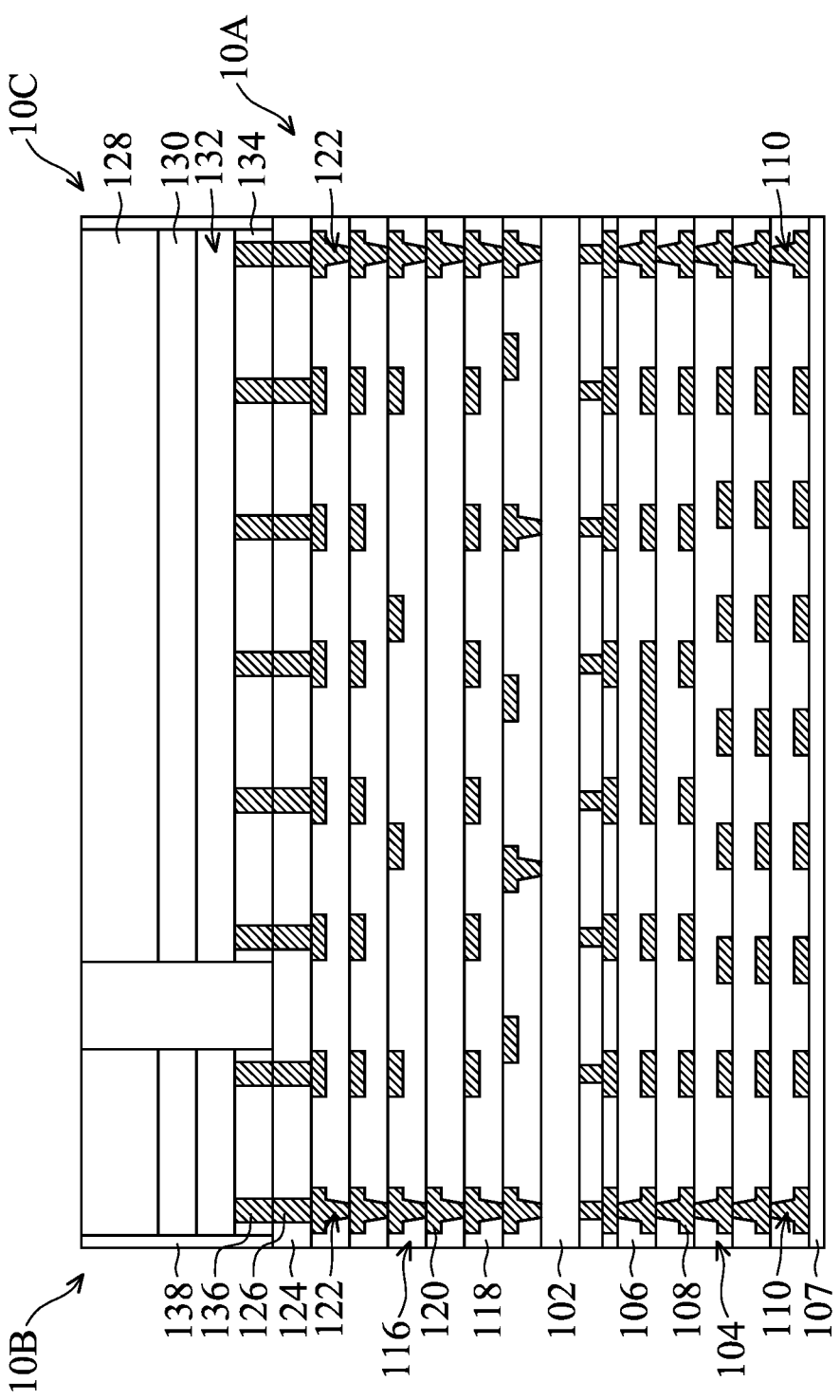

As shown in FIG. 1H, the carrier substrate 112 and the adhesive film 114 are removed, in accordance with some embodiments. As a result, the protective layer 107 is exposed. A light irradiation operation (such as UV light irradiation operation) may be used to reduce the adhesive ability of the adhesive film 114, so as to detach the carrier substrate 112 and the adhesive film 114.

Figure 1I:
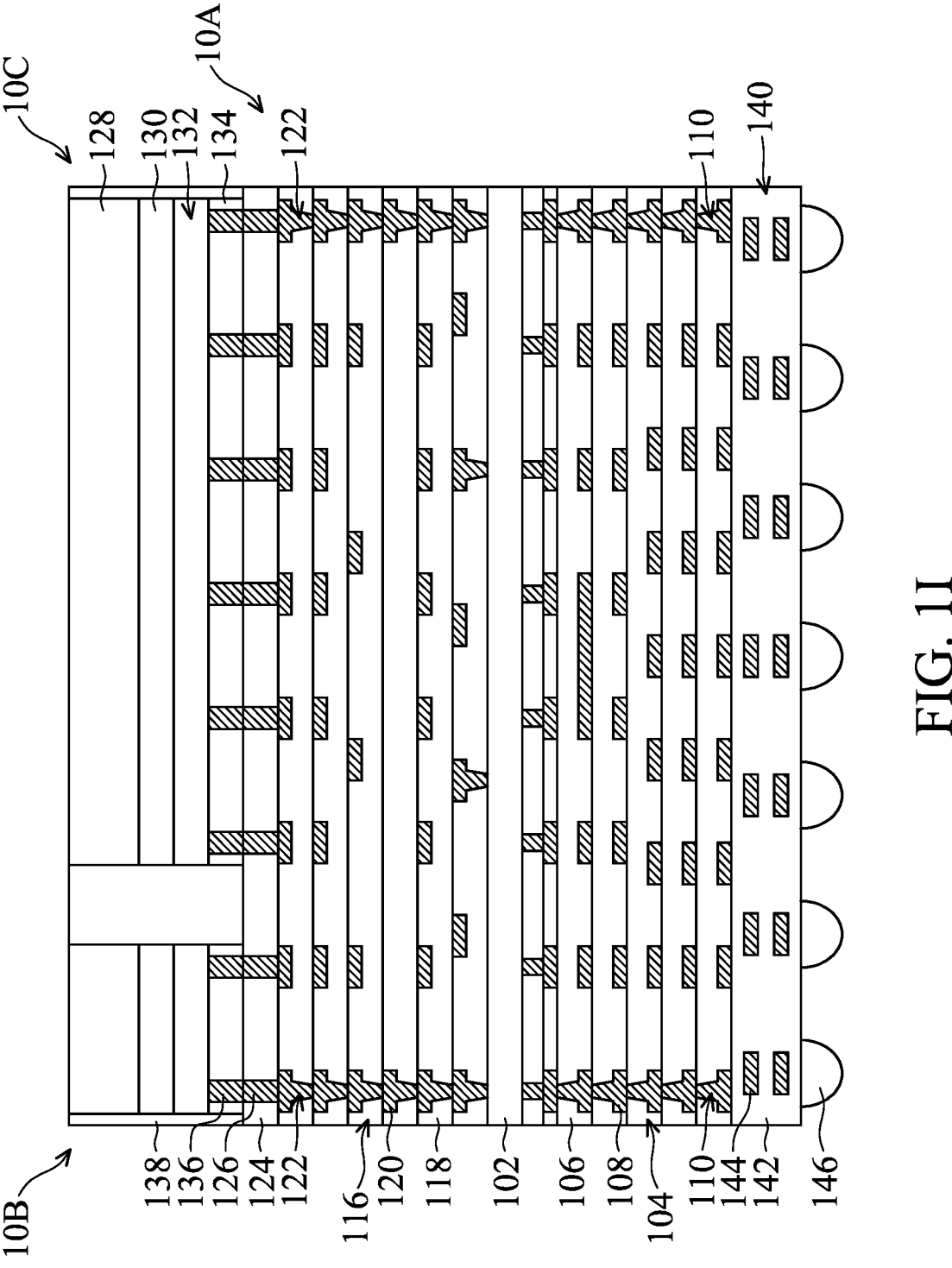

As shown in FIG. 1I, the protective layer 107 is then removed, in accordance with some embodiments. As a result, some of the conductive features 108 of the front-side interconnection structure 104 are exposed. The protective layer 107 may be removed using a CMP process, a grinding process, an etching process, another applicable process, or a combination thereof.

Afterwards, a redistribution structure 140 and conductive bumps 146 are then formed on the front-side interconnection structure 104 of the chip structure 10A, as shown in FIG. 1I in accordance with some embodiments. The redistribution structure 140 may include multiple insulating layers 142 and multiple conductive features 144. The conductive features 144 may be used to provide electrical connections between the conductive bumps 146 and the front-side interconnection structure 104.

In some embodiments, the insulating layers 142 are made of or include silicon oxide, carbon-containing silicon oxide, silicon oxynitride, carbon-containing silicon oxynitride, polyimide, polybenzoxazole (PBO), one or more other suitable materials, or a combination thereof.

The conductive features 144 may include conductive line and conductive vias. The conductive features 144 may be made of or include copper, cobalt, aluminum, gold, one or more other suitable materials, or a combination thereof. The formation of the redistribution structure 140 may involve multiple deposition processes, multiple patterning processes, and multiple planarization processes.

The conductive bumps 146 may include a solder material. The solder material may be a tin-containing material. The tin-containing material may further include copper, silver, gold, aluminum, lead, one or more other suitable materials, or a combination thereof. In some other embodiments, the solder material is lead-free.

In some embodiments, there is no conductive via formed in the chip structure 10A to completely penetrate through the device portion 102 of the chip structure 10A. In some embodiments, there is no through chip via or through substrate via formed in the chip structures 10B and 10C. The chip structure 10B or 10C may communicate with the chip structure 10A through the via tower structures 122. The device elements formed in the chip structures 10A-10C may be electrically connected to the conductive bumps 146 through the via tower structures 122 and 110. In some embodiments, because the chip structures 10A-10C have no through substrate vias formed therein, it is not necessary to define keep out zones in the chip structures 10A-10C. More space is thus available for routing. The performance and reliability of the package structure are significantly improved.

In some embodiments, one or more dicing operations are used to separate the bonded chip structures into multiple package structures. In some embodiments, one of the package structures is shown in FIG. 1I. The package structure may function as a system on integrated chips (SoIC) that may further be integrated into a chip on wafer on substrate (CoWoS) package structure, an integrated fan-out (InFO) package structure, or the like. Many variations and/or modifications can be made to embodiments of the disclosure. In some other embodiments, no dicing operation is performed. The entirety of the bonded chip structures forms a single package structure.

In some embodiments, each of the chip structures 10B and 10C is narrower than the chip structure 10A, as shown in FIGS. 1F-1I. In some embodiments, multiple known good chips (such as the chip structures 10B and 10C) are bonded to a semiconductor wafer (such as the chip structure 10A) using a chip on wafer process. However, embodiments of the disclosure are not limited thereto. Many variations and/or modifications can be made to embodiments of the disclosure. In some other embodiments, the package structure is formed using a wafer on wafer process.

Figure 2A:
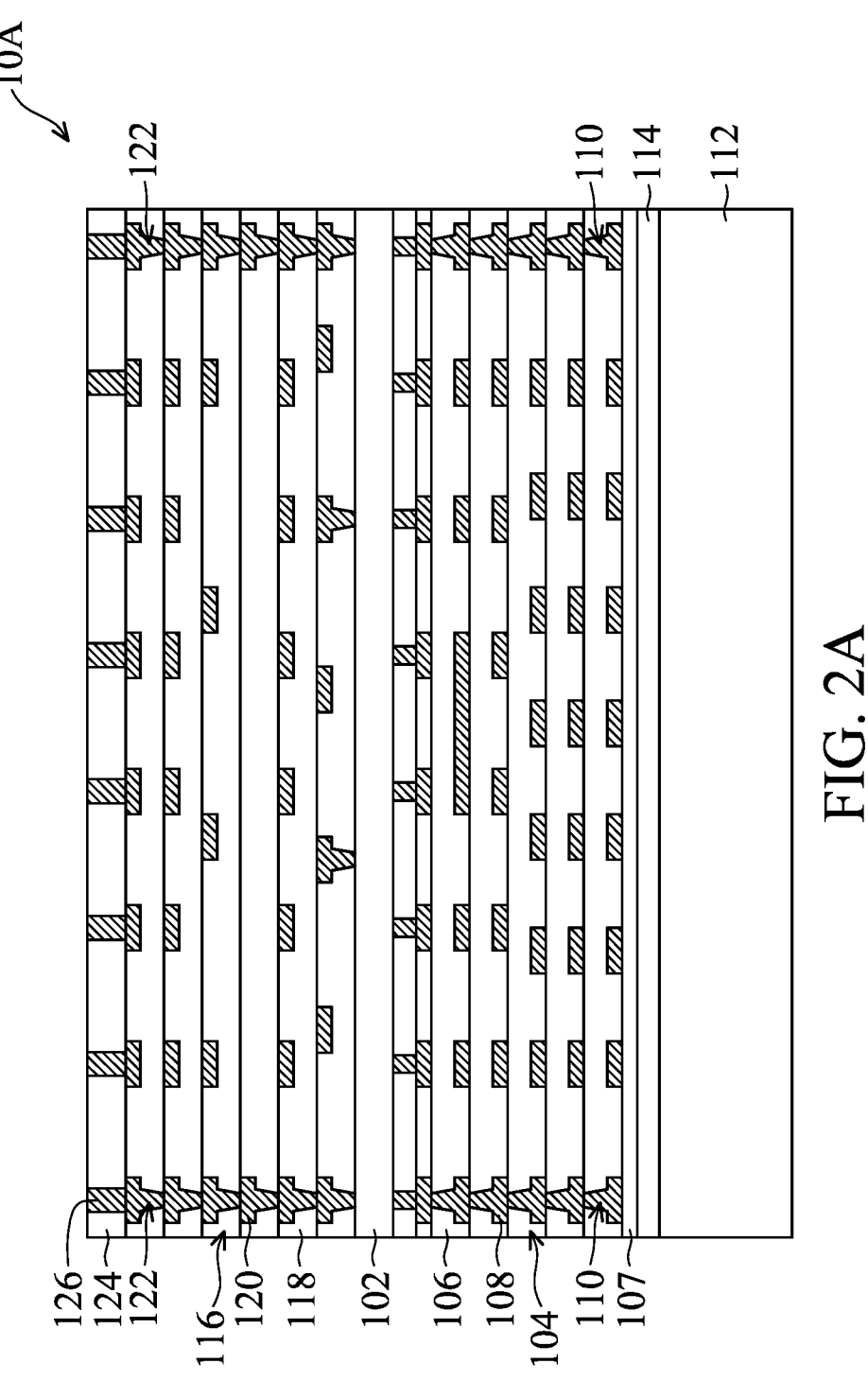
FIGS. 2A-2D are cross-sectional views of various stages of a process for forming a package structure, in accordance with some embodiments.

FIGS. 2A-2D are cross-sectional views of various stages of a process for forming a package structure, in accordance with some embodiments. As shown in FIG. 2A, a chip structure 10A is formed, in accordance with some embodiments. In some embodiments, the chip structure 10A shown in FIG. 2A is the same as or similar to the structure shown in FIG. 1E.

Figure 2B:
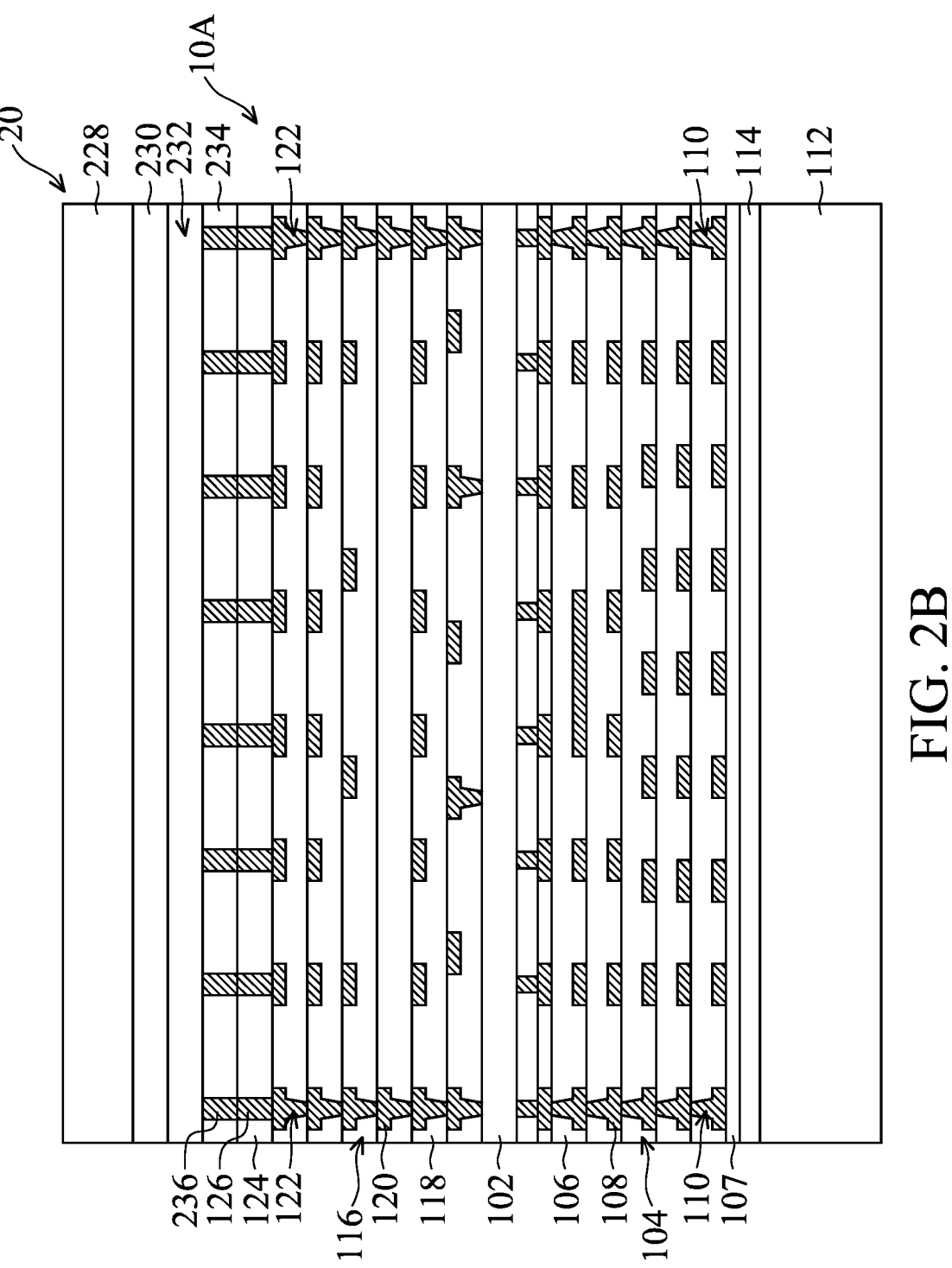

As shown in FIG. 2B, a chip structure 20 is bonded to chip structure 10A, in accordance with some embodiments. In some embodiments, the chip structure 20 is a semiconductor wafer. In some embodiments, the chip structure 20 is substantially as wide as the chip structure 10A, as shown in FIG. 2B.

In some embodiments, the chip structure 20 includes a semiconductor substrate 228. In some embodiments, the chip structure 20 includes a device portion 230. Multiple device elements are formed in and/or on the device portion 230. Examples of the various device elements include transistors (e.g., metal oxide semiconductor field effect transistors (MOSFET), complementary metal oxide semiconductor (CMOS) transistors, bipolar junction transistors (BJT), or other suitable elements. Multiple isolation features may be formed in the device portion 230 to electrically isolate the device elements. Various processes may be used to form the various device elements, including deposition, etching, implantation, photolithography, annealing, and/or other suitable processes.

In some embodiments, a front-side interconnection structure 232 is formed on the device portion 230 for providing electrical connections to the device elements. Similar to the front-side interconnection structure 104 of the chip structure 10A, the front-side interconnection structure 232 includes multiple conductive features and multiple dielectric layers.

In some embodiments, a dielectric layer 234 and multiple conductive features 236 are also formed. The front-side interconnection structure 232 thus further includes the dielectric layer 234 and the conductive features 236. The dielectric layer 234 and the conductive features 236 may function as bonding structures.

The dielectric layer 234 may be made of or include silicon oxide, carbon-containing silicon oxide, silicon oxynitride, carbon-containing silicon oxynitride, one or more other suitable materials, or a combination thereof. The dielectric layer 234 may be deposited using a CVD process, an ALD process, another applicable process, or a combination thereof.

Afterwards, one or more photolithography processes and one or more etching processes are used to partially remove the dielectric layer 234. As a result, multiple openings that are used to contain conductive features are formed in the dielectric layer 234. One or more conductive materials are then deposited over the dielectric layer 234 to overfill these openings. A planarization process is then used to remove the portions of the conductive materials that are outside of the openings. As a result, the remaining portions of the conductive materials form the conductive features 236, as shown in FIG. 2B.

The conductive materials may be made of or include copper, aluminum, cobalt, tungsten, nickel, gold, platinum, one or more other suitable materials, or a combination thereof. The conductive materials may be deposited using a CVD process, an electroplating process, an electrochemical plating process, an ALD process, a PVD process, another applicable process, or a combination thereof. The planarization process may include a CMP process, a grinding process, a dry polishing process, an etching process, another applicable process, or a combination thereof. Due to the planarization process, the chip structure 20 may have a highly planarized bonding surface.

As shown in FIG. 2B, the chip structure 20 is bonded to the chip structure 10A through direct bonding, in accordance with some embodiments. The direct bonding may be achieved using a hybrid bonding, a fusion bonding, or the like. The hybrid bonding may include metal-to-metal bonding such as the bonding between the conductive features 126 and 236 and dielectric-to-dielectric bonding such as the bonding between the dielectric layers 124 and 234. In some embodiments, there is no solder elements formed between the chip structures 10A and 20.

In some embodiments, the chip structure 20 is placed directly on the chip structure 10A. As a result, the dielectric layers 124 and 234 are in direct contact with each other and bonded to each other. The conductive features 126 and 236 are also in direct contact with each other.

In some embodiments, before the placing of the chip structure 20, planarization processes are performed, so as to provide highly planarized bonding surfaces of the chip structures 10A and 20. In some embodiments, there is no gap between the dielectric layers 124 and 234. In some embodiments, there is no gap between the conductive features 126 and 236. In some embodiments, a thermal operation is then used to enhance the bonding between the conductive features 126 and 236. The temperature of the thermal operation may within a range from about 100 degrees C. to about 700 degrees C.

Figure 2C:
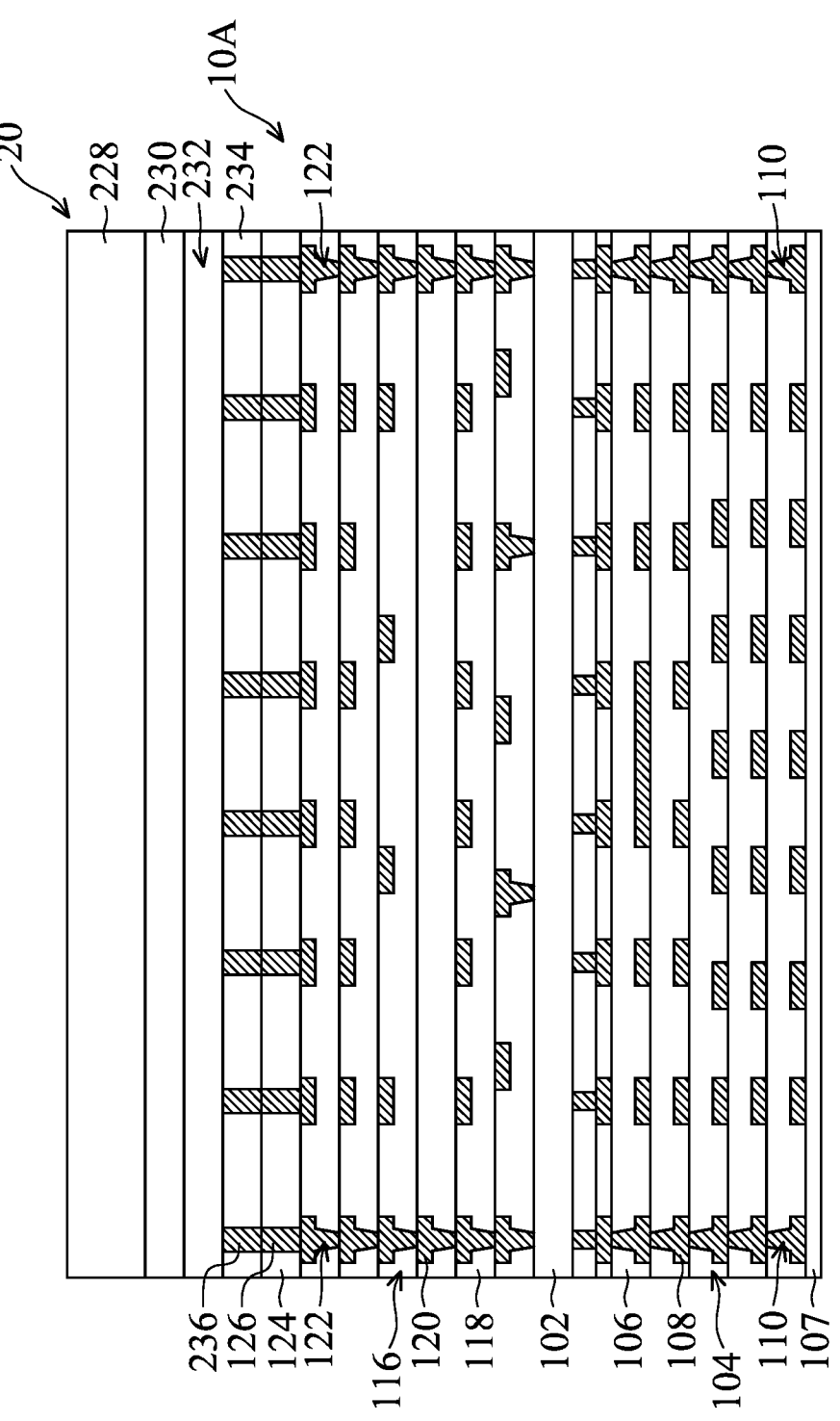

As shown in FIG. 2C, the carrier substrate 112 and the adhesive film 114 are removed, in accordance with some embodiments. As a result, the protective layer 107 is exposed. A light irradiation operation (such as UV light irradiation operation) may be used to reduce the adhesive ability of the adhesive film 114, so as to detach the carrier substrate 112 and the adhesive film 114.

Figure 2D:
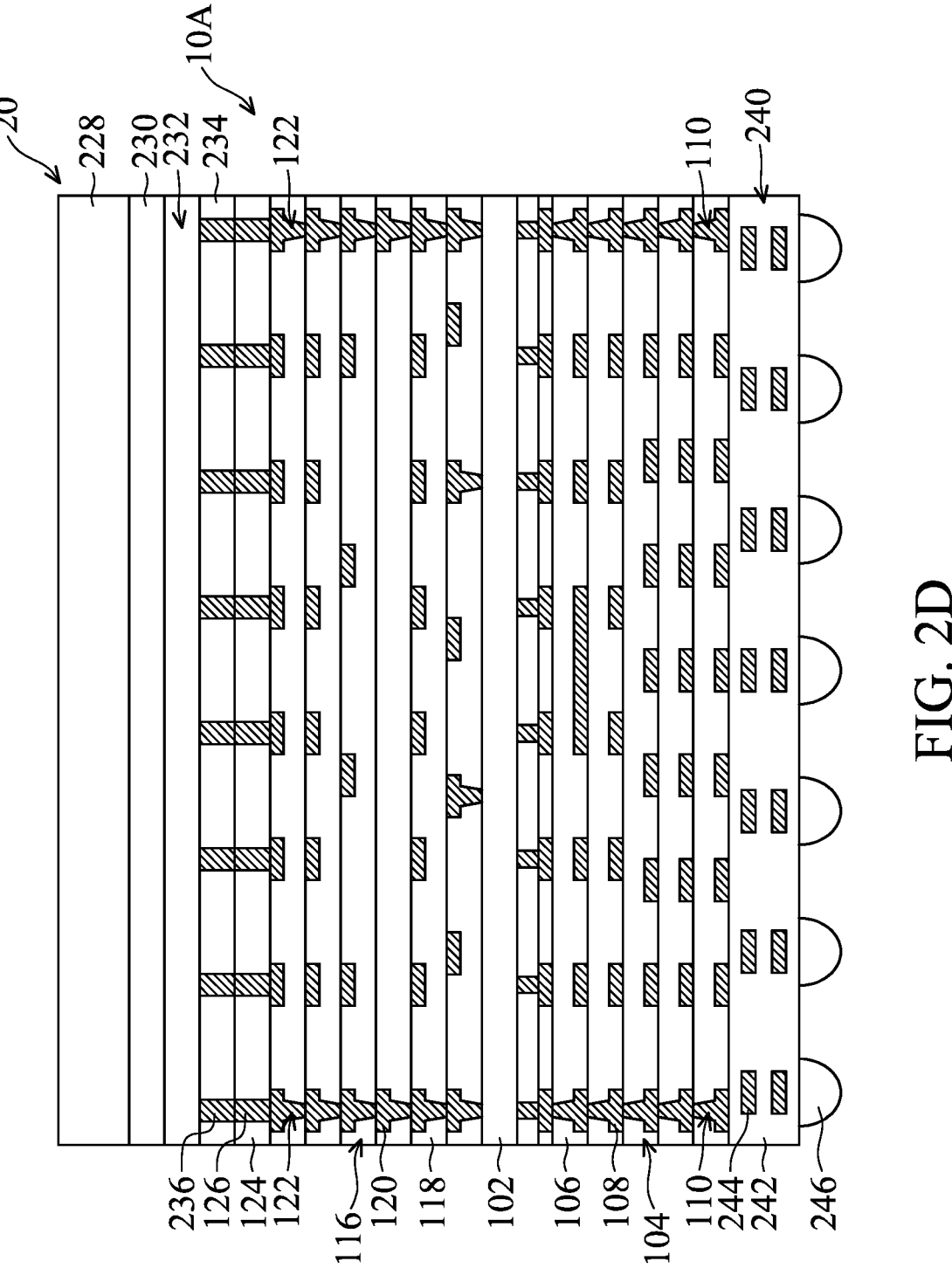

As shown in FIG. 2D, the protective layer 107 is then removed, in accordance with some embodiments. As a result, some of the conductive features 108 of the front-side interconnection structure 104 are exposed. The protective layer 107 may be removed using a CMP process, a grinding process, an etching process, another applicable process, or a combination thereof.

Afterwards, a redistribution structure 240 and conductive bumps 246 are then formed on the front-side interconnection structure 104 of the chip structure 10A, as shown in FIG. 2D in accordance with some embodiments. The redistribution structure 240 may include multiple insulating layers 242 and multiple conductive features 244. The conductive features 244 may be used to provide electrical connections between the conductive bumps 246 and the front-side interconnection structure 104.

In some embodiments, the insulating layers 242 are made of or include silicon oxide, carbon-containing silicon oxide, silicon oxynitride, carbon-containing silicon oxynitride, polyimide, polybenzoxazole (PBO), one or more other suitable materials, or a combination thereof.

The conductive features 244 may include conductive line and conductive vias. The conductive features 244 may be made of or include copper, cobalt, aluminum, gold, one or more other suitable materials, or a combination thereof. The formation of the redistribution structure 240 may involve multiple deposition processes, multiple patterning processes, and multiple planarization processes.

The conductive bumps 246 may include a solder material. The solder material may be a tin-containing material. The tin-containing material may further include copper, silver, gold, aluminum, lead, one or more other suitable materials, or a combination thereof. In some other embodiments, the solder material is lead-free.

In some embodiments, there is no conductive via formed in the chip structure 10A to completely penetrate through the device portion 102 of the chip structure 10A. In some embodiments, there is no through chip via or through substrate via formed in the chip structure 20. The chip structure 20 may communicate with the chip structure 10A through the via tower structures 122. The device elements formed in the chip structures 10A and 20 may be electrically connected to the conductive bumps 246 through the via tower structures 122 and 110. In some embodiments, because the chip structures 10A and 20 have no through substrate vias formed therein, it is not necessary to define keep out zones in the chip structures 10A and 20. More space is thus available for routing. The performance and reliability of the package structure are significantly improved.

In some embodiments, one or more dicing operations are used to separate the bonded chip structures into multiple package structures. In some embodiments, one of the package structures is shown in FIG. 2D. The package structure may function as a system on integrated chips (SoIC) that may further be integrated into a chip on wafer on substrate (CoWoS) package structure, an integrated fan-out (InFO) package structure, or the like. Many variations and/or modifications can be made to embodiments of the disclosure. In some other embodiments, no dicing operation is performed. The entirety of the bonded chip structures forms a single package structure.

In some embodiments as illustrated in FIGS. 1A-1I and 2A-2D, the overlying chip structure is bonded to an underlying chip structure in a face-to-back manner. For example, as shown in FIG. 1I, the front-side interconnection structure 132 of the chip structure 10B or 10C faces the back-side interconnection structure 116 of the chip structure 10A. However, embodiments of the disclosure are not limited thereto. Many variations and/or modifications can be made to embodiments of the disclosure. In some other embodiments, the overlying chip structure is bonded to an underlying chip structure in a face-to-face manner.

Figure 3A:
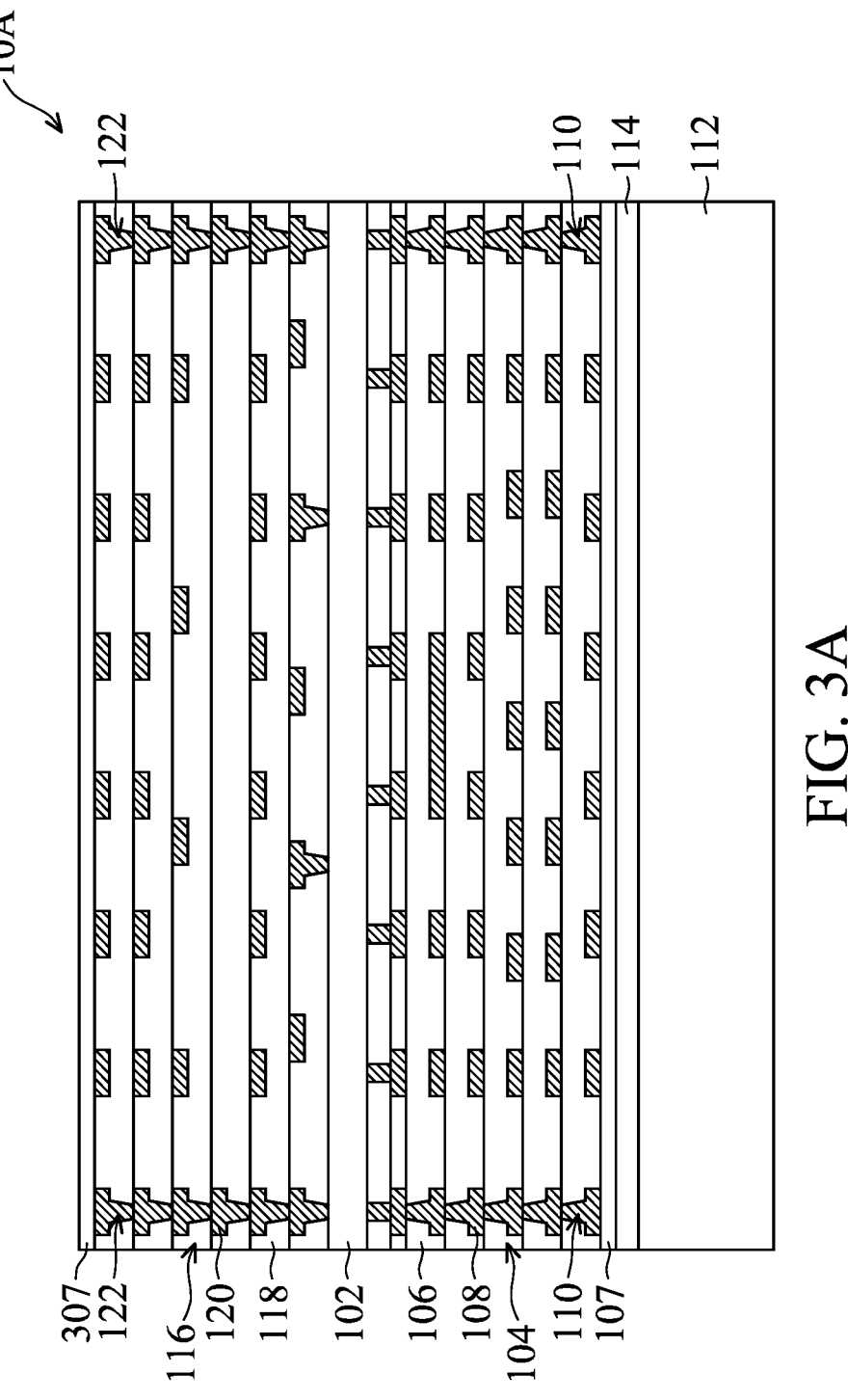
FIGS. 3A-3G are cross-sectional views of various stages of a process for forming a package structure, in accordance with some embodiments.

FIGS. 3A-3G are cross-sectional views of various stages of a process for forming a package structure, in accordance with some embodiments. As shown in FIG. 3A, a chip structure 10A is formed, in accordance with some embodiments. In some embodiments, the chip structure 10A shown in FIG. 3A is similar to the structure shown in FIG. 1D. In some embodiments, a protective layer 307 is then formed. The protection layer 307 may function as a protective portion of the back-side interconnection structure 116 of the chip structure 10A. The protective layer 307 may protect the underlying conductive features 120 during the subsequent processes. The material and formation method of the protective layer 307 may be the same as or similar to those of the protective layer 107.

Figure 3B:
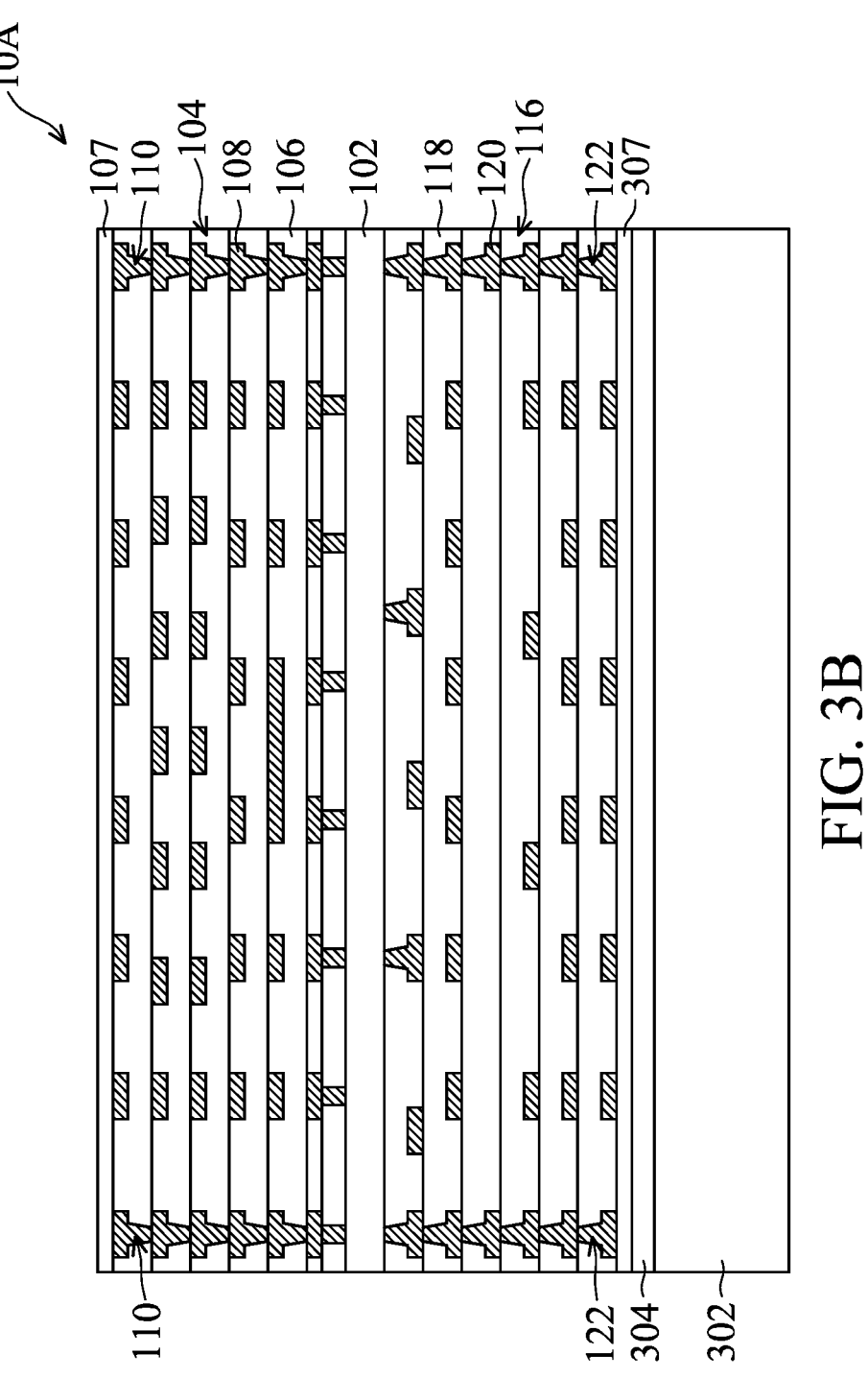

Afterwards, the structure shown in FIG. 3A is turned upside down and attached to a carrier substrate 302 through an adhesive film 304, in accordance with some embodiments. The carrier substrate 302 may be a carrier wafer. The carrier wafer may include a semiconductor wafer (such as a silicon wafer), a dielectric wafer (such as a glass wafer), or the like. Then, the carrier substrate 112 and the adhesive film 114 are removed. As a result, the structure shown in FIG. 3B is formed, in accordance with some embodiments. The protective layer 107 of the front-side interconnection structure 104 is exposed.

Figure 3C:
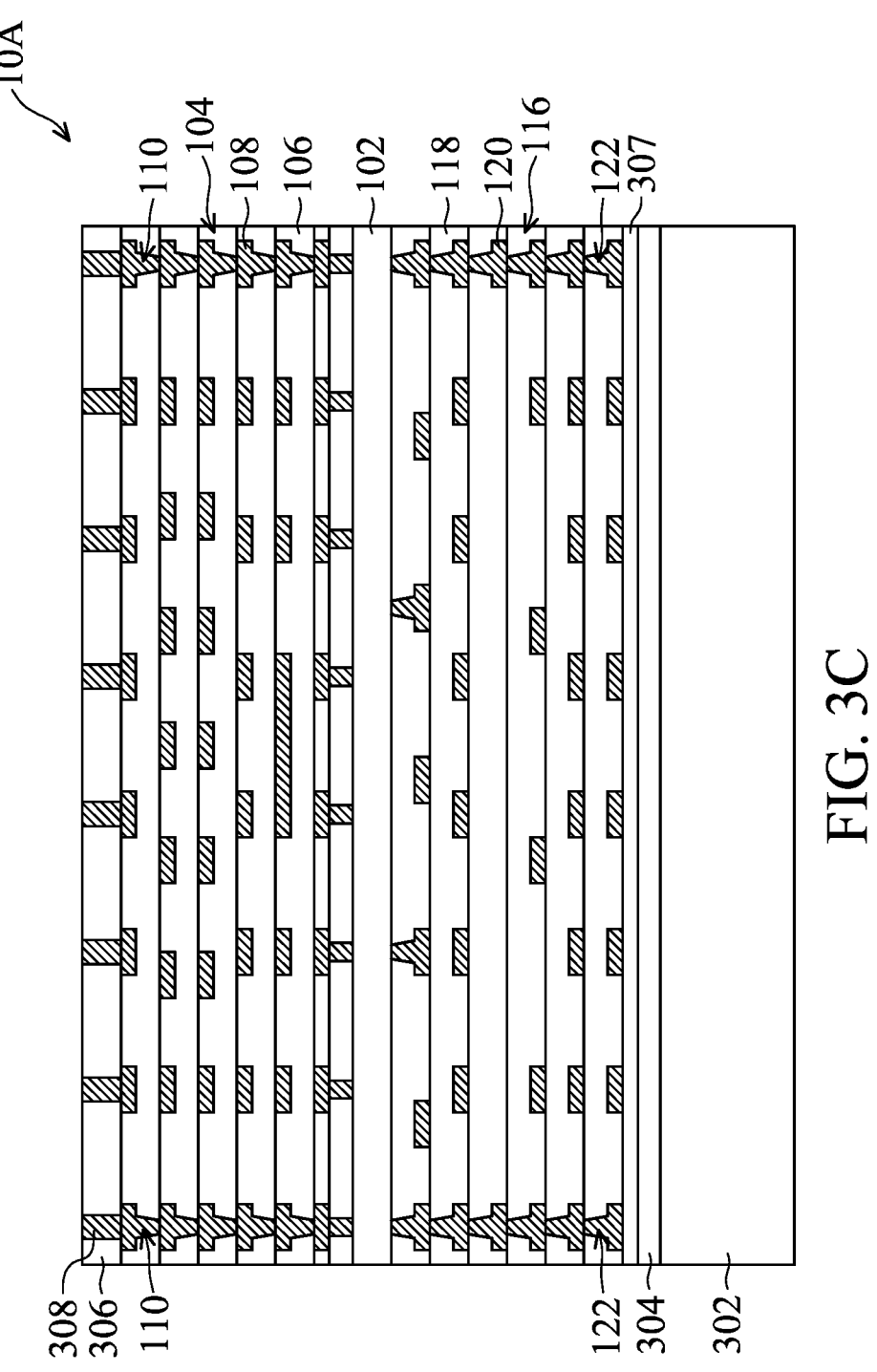

As shown in FIG. 3C, the protective layer 107 is removed, in accordance with some embodiments. As a result, some of the conductive features 108 and the via tower structures 110 are exposed. The protective layer 107 may be removed using a CMP process, a grinding process, an etching process, another applicable process, or a combination thereof.

Afterwards, a dielectric layer 306 and multiple conductive features 308 are formed over the top surfaces of the dielectric layers 106 and the conductive features 108, as shown in FIG. 3C in accordance with some embodiments. As a result, the front-side interconnection structure 104 further includes the dielectric layer 306 and the conductive features 308. The dielectric layer 306 and the conductive features 308 may function as bonding structures.

The dielectric layer 306 may be made of or include silicon oxide, carbon-containing silicon oxide, silicon oxynitride, carbon-containing silicon oxynitride, one or more other suitable materials, or a combination thereof. The dielectric layer 306 may be deposited using a CVD process, an ALD process, another applicable process, or a combination thereof.

Afterwards, one or more photolithography processes and one or more etching processes are used to partially remove the dielectric layer 306. As a result, multiple openings that are used to contain conductive features are formed in the dielectric layer 306. One or more conductive materials are then deposited over the dielectric layer 306 to overfill these openings. A planarization process is then used to remove the portions of the conductive materials that are outside of the openings. As a result, the remaining portions of the conductive materials form the conductive features 308, as shown in FIG. 3C.

The conductive materials may be made of or include copper, aluminum, cobalt, tungsten, nickel, gold, platinum, one or more other suitable materials, or a combination thereof. The conductive materials may be deposited using a CVD process, an electroplating process, an electrochemical plating process, an ALD process, a PVD process, another applicable process, or a combination thereof. The planarization process may include a CMP process, a grinding process, a dry polishing process, an etching process, another applicable process, or a combination thereof. The planarization process may be used to provide a highly planarized bonding surface of the chip structure 10A.

Figure 3D:
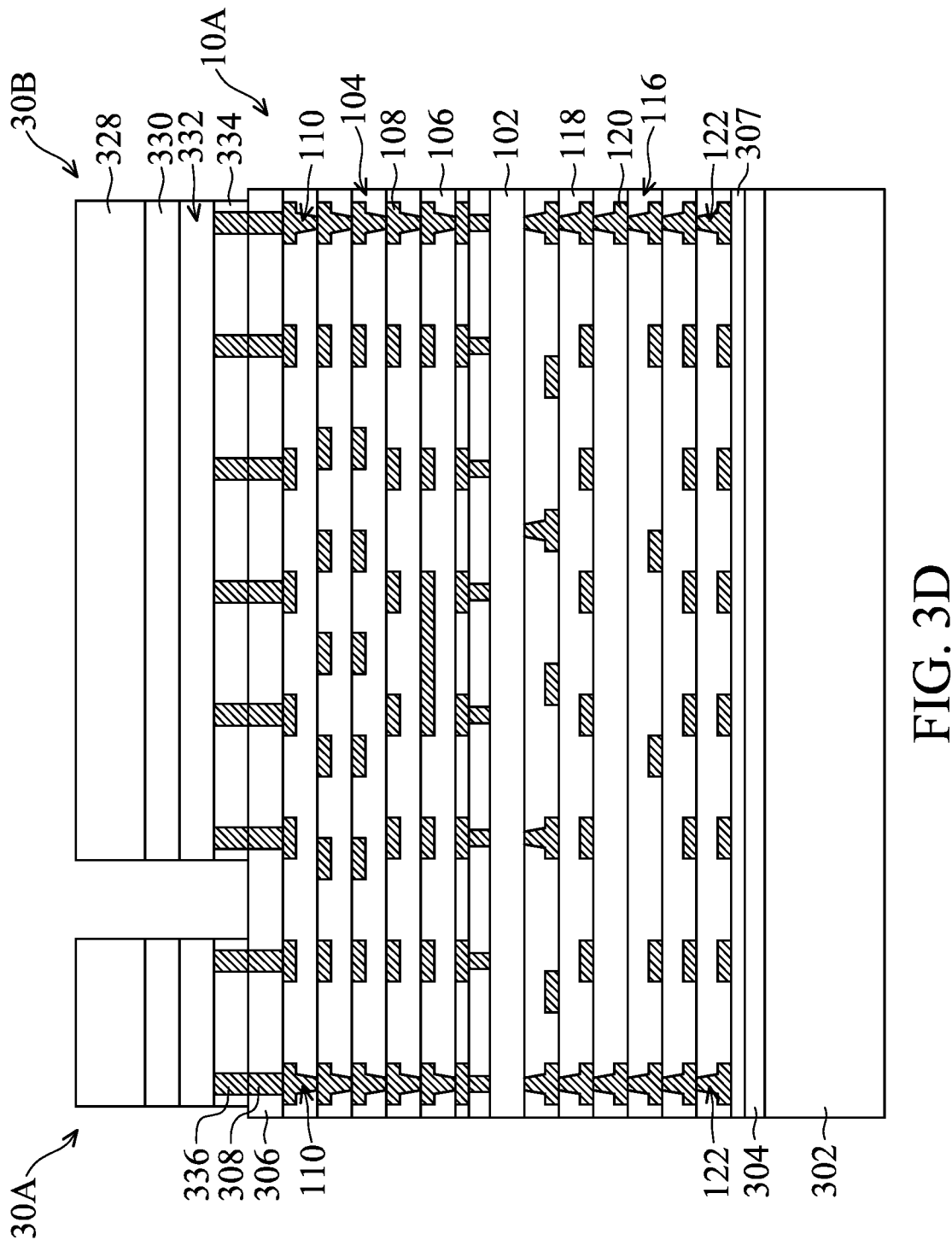

As shown in FIG. 3D, chip structures 30A and 30B are bonded to the chip structure 10A, in accordance with some embodiments. In some embodiments, each of the chip structures 30A and 30B is a known good chip. In some embodiments, the chip structure 10A is formed using a more advanced technology node than the chip structure 30A or 30B. In some embodiments, the average gate width of the transistors formed in the chip structure 10A is smaller than the average gate width of the transistors formed in the chip structure 30A or 30B.

In some embodiments, each of the chip structures 30A and 30B includes a semiconductor substrate 328. In some embodiments, each of the chip structures 30A and 30B includes a device portion 330. Multiple device elements are formed in and/or on the device portion 330. Examples of the various device elements include transistors (e.g., metal oxide semiconductor field effect transistors (MOSFET), complementary metal oxide semiconductor (CMOS) transistors, bipolar junction transistors (BJT), or other suitable elements. Multiple isolation features may be formed in the device portion 330 to electrically isolate the device elements. Various processes may be used to form the various device elements, including deposition, etching, implantation, photolithography, annealing, and/or other suitable processes.

In some embodiments, a front-side interconnection structure 332 is formed on the device portion 330 for providing electrical connections to the device elements. Similar to the front-side interconnection structure 104 of the chip structure 10A, the front-side interconnection structure 332 includes multiple conductive features and multiple dielectric layers.

In some embodiments, a dielectric layer 334 and multiple conductive features 336 are also formed. The front-side interconnection structure 332 thus further includes the dielectric layer 334 and the conductive features 336. The dielectric layer 334 and the conductive features 336 may function as bonding structures.

The dielectric layer 334 may be made of or include silicon oxide, carbon-containing silicon oxide, silicon oxynitride, carbon-containing silicon oxynitride, one or more other suitable materials, or a combination thereof. The dielectric layer 334 may be deposited using a CVD process, an ALD process, another applicable process, or a combination thereof.

Afterwards, one or more photolithography processes and one or more etching processes are used to partially remove the dielectric layer 334. As a result, multiple openings that are used to contain conductive features are formed in the dielectric layer 334. One or more conductive materials are then deposited over the dielectric layer 334 to overfill these openings. A planarization process is then used to remove the portions of the conductive materials that are outside of the openings. As a result, the remaining portions of the conductive materials form the conductive features 336, as shown in FIG. 3D.

The conductive materials may be made of or include copper, aluminum, cobalt, tungsten, nickel, gold, platinum, one or more other suitable materials, or a combination thereof. The conductive materials may be deposited using a CVD process, an electroplating process, an electrochemical plating process, an ALD process, a PVD process, another applicable process, or a combination thereof. The planarization process may include a CMP process, a grinding process, a dry polishing process, an etching process, another applicable process, or a combination thereof. Due to the planarization process, each of the chip structures 30A and 30B may have a highly planarized bonding surface.

As shown in FIG. 3D, the chip structures 30A and 30B are bonded to the chip structure 10A through direct bonding, in accordance with some embodiments. The direct bonding may be achieved using a hybrid bonding, a fusion bonding, or the like. The hybrid bonding may include metal-to-metal bonding such as the bonding between the conductive features 308 and 336 and dielectric-to-dielectric bonding such as the bonding between the dielectric layers 306 and 334. In some embodiments, there is no solder elements formed between the chip structures 10A and 30A. In some embodiments, there is no solder elements formed between the chip structures 10A and 30B.

In some embodiments, the chip structures 30A and 30B are placed directly on the chip structure 10A. As a result, the dielectric layers 306 and 334 are in direct contact with each other and bonded to each other. The conductive features 308 and 336 are also in direct contact with each other.

In some embodiments, before the placing of the chip structures 30A and 30B, planarization processes are performed, so as to provide highly planarized bonding surfaces of the chip structures 10A, 30A, and 30B. In some embodiments, there is no gap between the dielectric layers 306 and 334. In some embodiments, there is no gap between the conductive features 308 and 336. In some embodiments, a thermal operation is then used to enhance the bonding between the conductive features 308 and 336. The temperature of the thermal operation may within a range from about 100 degrees C. to about 700 degrees C.

Figure 3E:
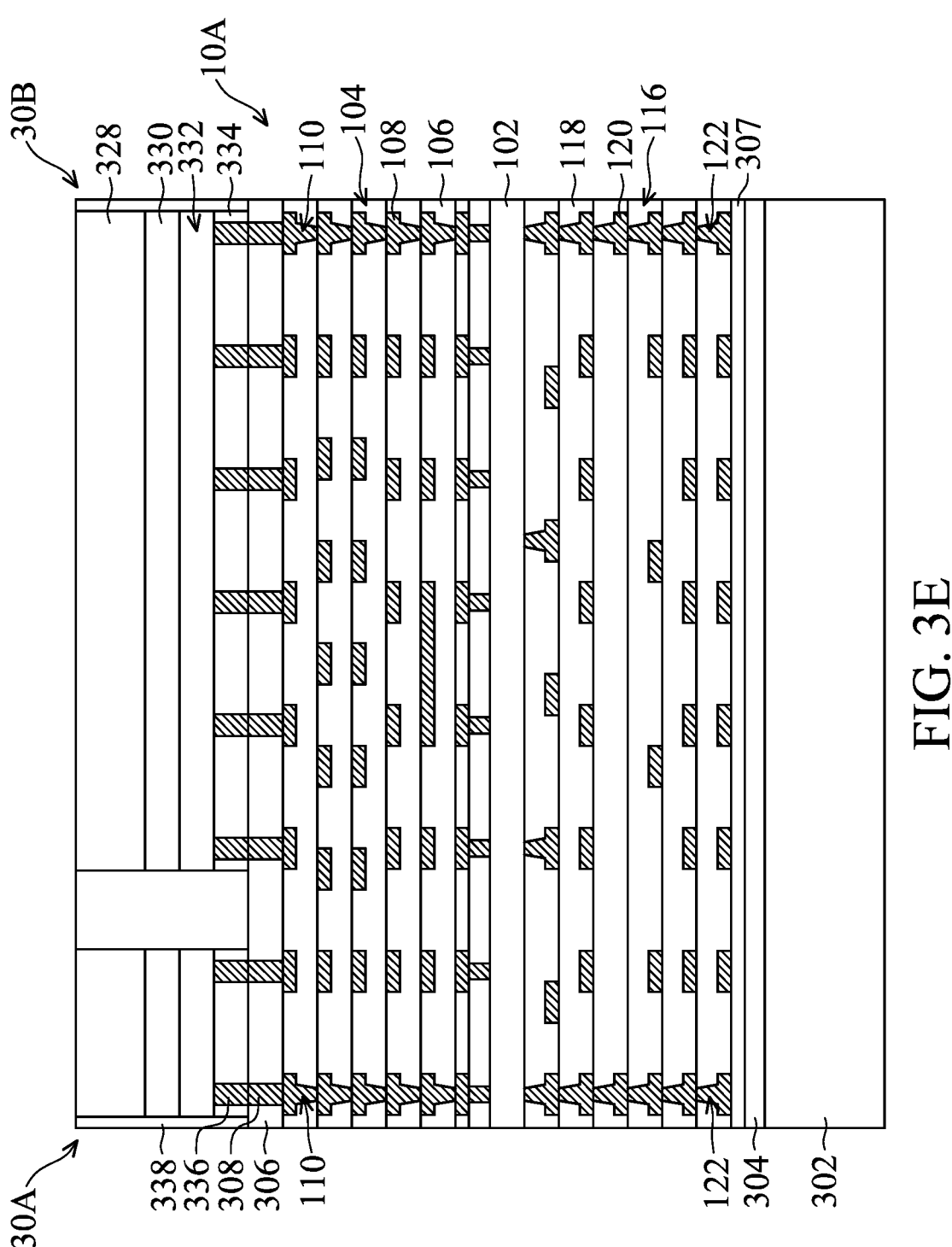

As shown in FIG. 3E, a protective layer 338 is formed over the chip structure 10A to laterally surround the chip structures 30A and 30B, in accordance with some embodiments. The protective layer 338 may be made of or include silicon oxide, silicon oxynitride, carbon-containing silicon oxide, carbon-containing silicon oxynitride, a molding material, another suitable material, or a combination thereof. The molding material may include an epoxy-based material dispersed with fillers such as silica fibers, carbon-containing fibers, or the like.

In some embodiments, a protective material layer is formed over the chip structures 10A, 30A, and 30B. The protective material layer may be formed using a CVD process, an ALD process, a molding process, another applicable process, or a combination thereof. Afterwards, a planarization process may be used to partially remove the protective material layer. As a result, the remaining portion of the protective material layer forms the protective layer 338, as shown in FIG. 3E. In some embodiments, the top surfaces of the protective layer 338 and the chip structures 30A and 30B are substantially level.

As shown in FIG. 3E, the top surfaces of the chip structures 30A and 30B are substantially level. However, embodiments of the disclosure are not limited thereto. Many variations and/or modifications can be made to embodiments of the disclosure. In some other embodiments, the chip structure 30A is taller than the chip structure 30B. In these cases, the protective layer 338 may cover the top surface of the chip structure 30B. The top surfaces of the protective layer 338 and the chip structure 30A may be substantially level.

Figure 3F:
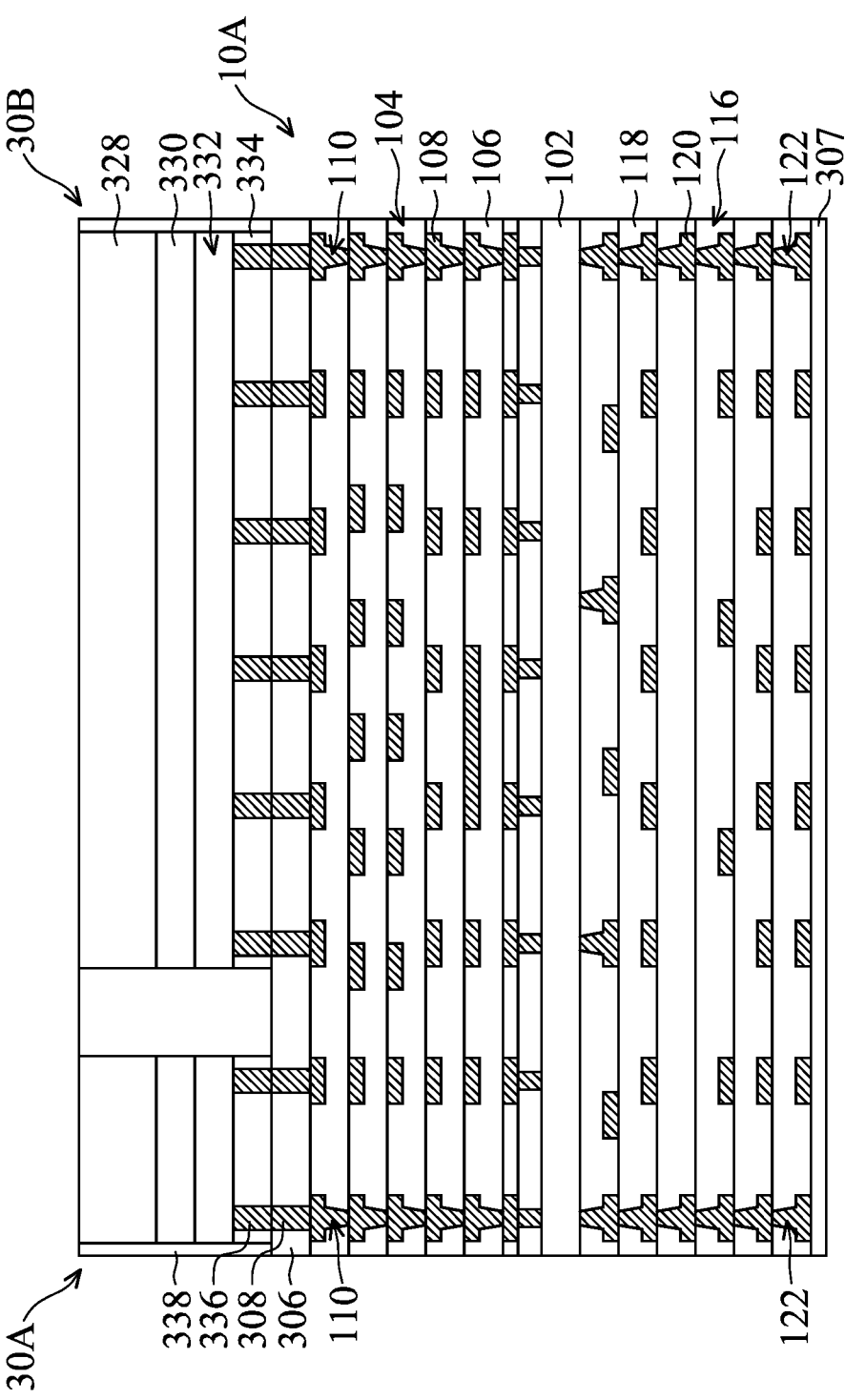

As shown in FIG. 3F, the carrier substrate 302 and the adhesive film 304 are removed, in accordance with some embodiments. As a result, the protective layer 307 is exposed.

Figure 3G:
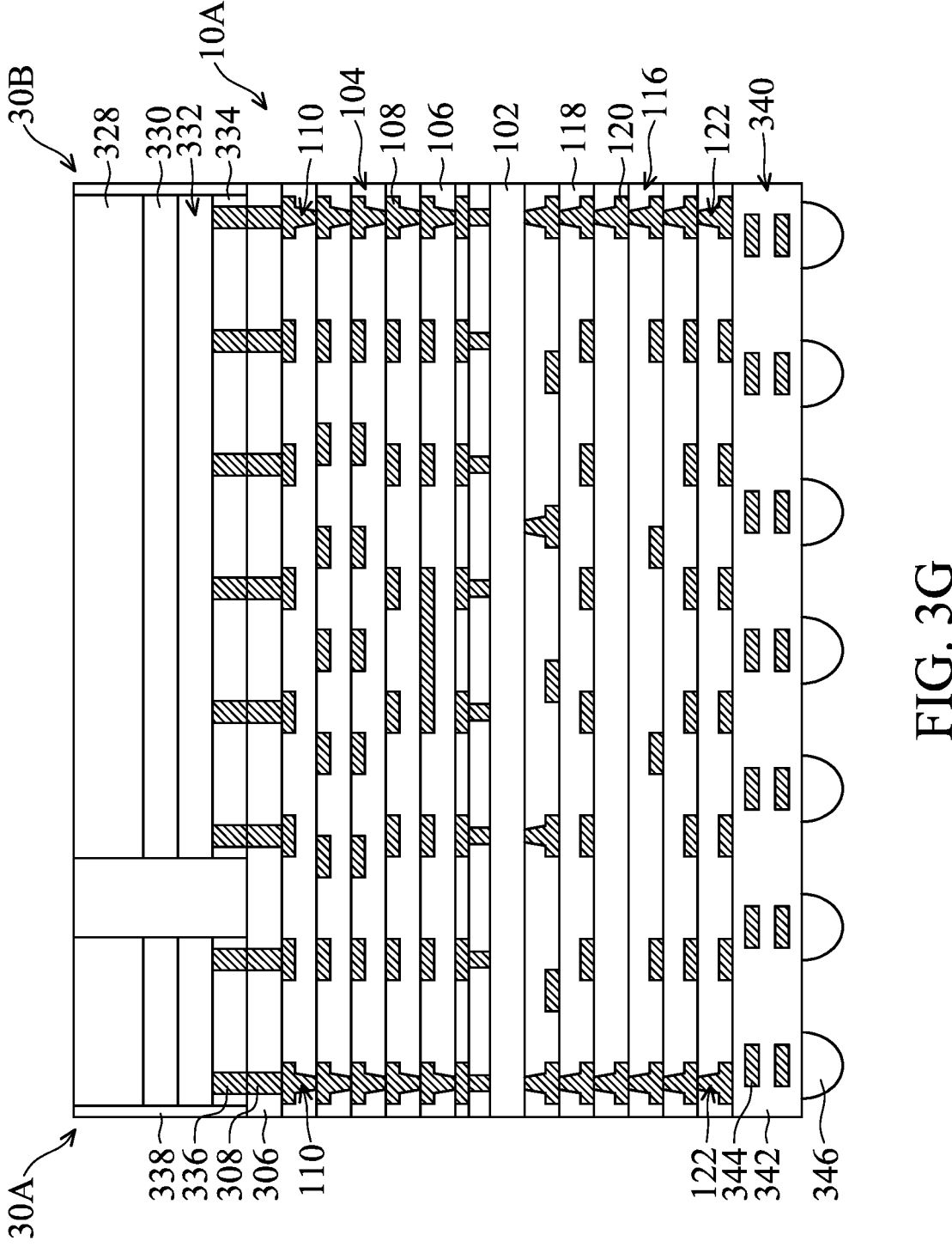

As shown in FIG. 3G, the protective layer 307 is then removed, in accordance with some embodiments. As a result, some of the conductive features 120 of the back-side interconnection structure 116 are exposed. The protective layer 307 may be removed using a CMP process, a grinding process, an etching process, another applicable process, or a combination thereof.

Afterwards, a redistribution structure 340 and conductive bumps 346 are then formed on the back-side interconnection structure 116 of the chip structure 10A, as shown in FIG. 3G in accordance with some embodiments. The redistribution structure 340 may include multiple insulating layers 342 and multiple conductive features 344. The conductive features 344 may be used to provide electrical connections between the conductive bumps 346 and the back-side interconnection structure 116.

In some embodiments, the insulating layers 342 are made of or include silicon oxide, carbon-containing silicon oxide, silicon oxynitride, carbon-containing silicon oxynitride, polyimide, polybenzoxazole (PBO), one or more other suitable materials, or a combination thereof.

The conductive features 344 may include conductive line and conductive vias. The conductive features 344 may be made of or include copper, cobalt, aluminum, gold, one or more other suitable materials, or a combination thereof. The formation of the redistribution structure 340 may involve multiple deposition processes, multiple patterning processes, and multiple planarization processes.

The conductive bumps 346 may include a solder material. The solder material may be a tin-containing material. The tin-containing material may further include copper, silver, gold, aluminum, lead, one or more other suitable materials, or a combination thereof. In some other embodiments, the solder material is lead-free.

In some embodiments, there is no conductive via formed in the chip structure 10A to completely penetrate through the device portion 102 of the chip structure 10A. In some embodiments, there is no through chip via or through substrate via formed in the chip structures 30A and 30B. The chip structure 30A or 30B may communicate with the chip structure 10A through the via tower structures 110. The device elements formed in the chip structures 10A, 30A, and 30B may be electrically connected to the conductive bumps 346 through the via tower structures 122 and 110. In some embodiments, because the chip structures 10A, 30A, and 30B have no through substrate vias formed therein, it is not necessary to define keep out zones in the chip structures 10A, 30A, and 30B. More space is thus available for routing. The performance and reliability of the package structure are significantly improved.

In some embodiments, one or more dicing operations are used to separate the bonded chip structures into multiple package structures. In some embodiments, one of the package structures is shown in FIG. 3G. The package structure may function as a system on integrated chips (SoIC) that may further be integrated into a chip on wafer on substrate (CoWoS) package structure, an integrated fan-out (InFO) package structure, or the like. Many variations and/or modifications can be made to embodiments of the disclosure. In some other embodiments, no dicing operation is performed. The entirety of the bonded chip structures forms a single package structure.

In some embodiments, each of the chip structures 30A and 30B is narrower than the chip structure 10A, as shown in FIGS. 3D-3G. In some embodiments, multiple known good chips (such as the chip structures 30A and 30B) are bonded to a semiconductor wafer (such as the chip structure 10A) using a chip on wafer process. However, embodiments of the disclosure are not limited thereto. Many variations and/or modifications can be made to embodiments of the disclosure. In some other embodiments, the package structure is formed using a wafer on wafer process.

Figure 4A:
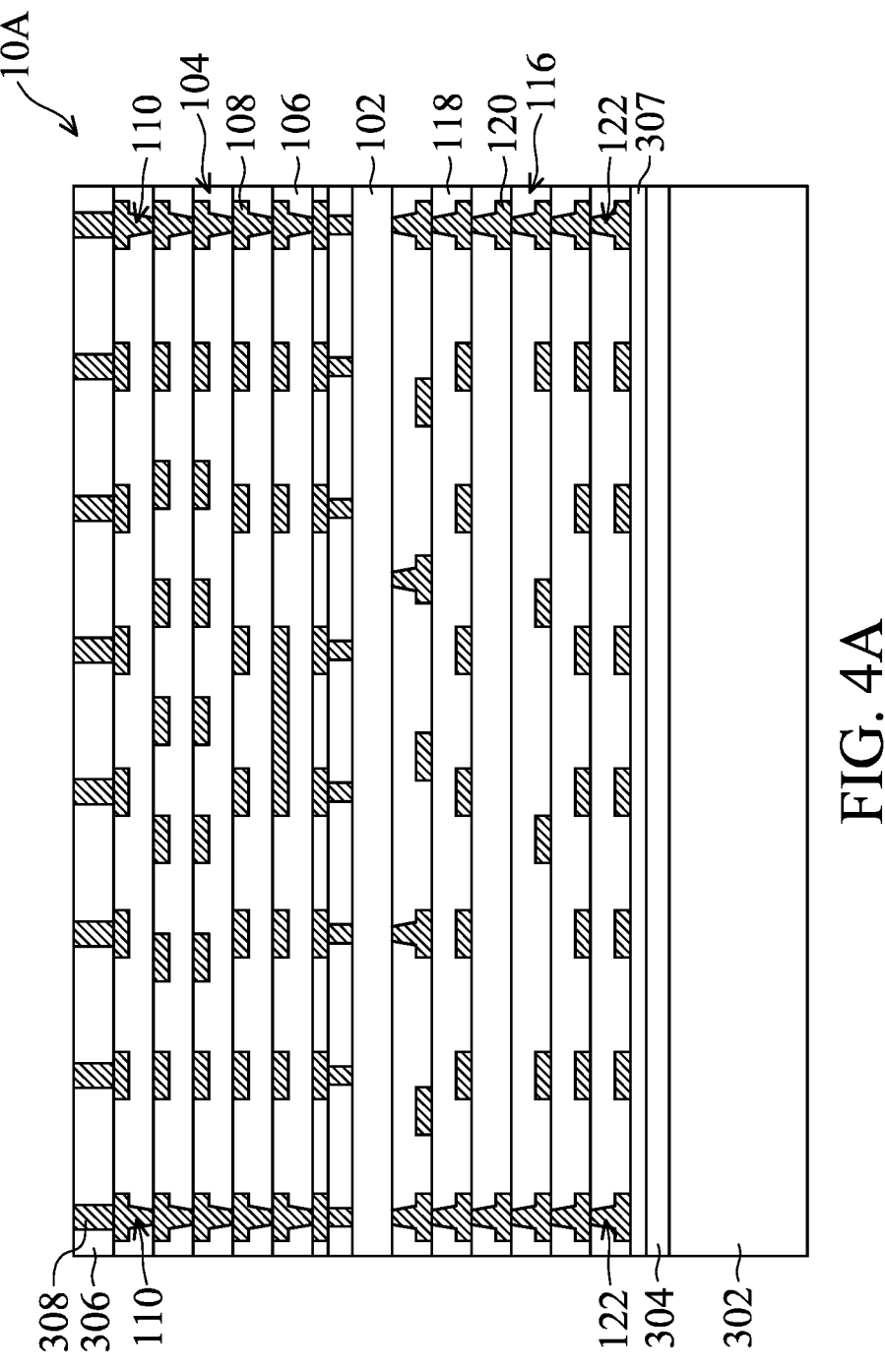
FIGS. 4A-4D are cross-sectional views of various stages of a process for forming a package structure, in accordance with some embodiments.

FIGS. 4A-4D are cross-sectional views of various stages of a process for forming a package structure, in accordance with some embodiments. As shown in FIG. 4A, a chip structure 10A is formed, in accordance with some embodiments. In some embodiments, the chip structure 10A shown in FIG. 4A is the same as or similar to the structure shown in FIG. 3C.

Figure 4B:
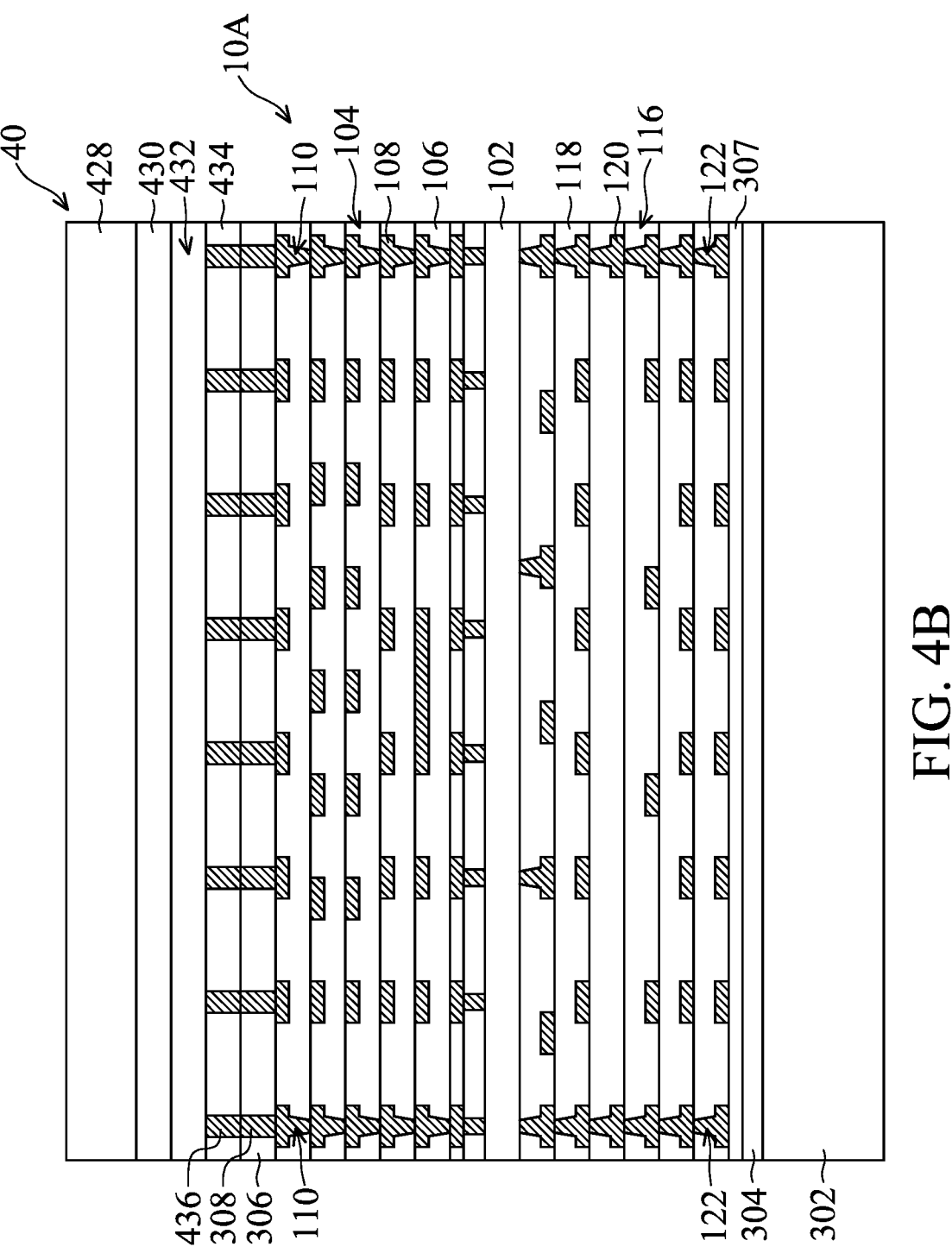

As shown in FIG. 4B, a chip structure 40 is bonded to chip structure 10A, in accordance with some embodiments. In some embodiments, the chip structure 40 is a semiconductor wafer. In some embodiments, the chip structure 40 is substantially as wide as the chip structure 10A, as shown in FIG. 4B.

In some embodiments, the chip structure 40 includes a semiconductor substrate 428. In some embodiments, the chip structure 40 includes a device portion 430. Multiple device elements are formed in and/or on the device portion 430. Examples of the various device elements include transistors (e.g., metal oxide semiconductor field effect transistors (MOSFET), complementary metal oxide semiconductor (CMOS) transistors, bipolar junction transistors (BJT), or other suitable elements. Multiple isolation features may be formed in the device portion 430 to electrically isolate the device elements. Various processes may be used to form the various device elements, including deposition, etching, implantation, photolithography, annealing, and/or other suitable processes.

In some embodiments, a front-side interconnection structure 432 is formed on the device portion 430 for providing electrical connections to the device elements. Similar to the front-side interconnection structure 104 of the chip structure 10A, the front-side interconnection structure 432 includes multiple conductive features and multiple dielectric layers.

In some embodiments, a dielectric layer 434 and multiple conductive features 436 are also formed. The front-side interconnection structure 432 thus further includes the dielectric layer 434 and the conductive features 436. The dielectric layer 434 and the conductive features 436 may function as bonding structures.

The dielectric layer 434 may be made of or include silicon oxide, carbon-containing silicon oxide, silicon oxynitride, carbon-containing silicon oxynitride, one or more other suitable materials, or a combination thereof. The dielectric layer 434 may be deposited using a CVD process, an ALD process, another applicable process, or a combination thereof.

Afterwards, one or more photolithography processes and one or more etching processes are used to partially remove the dielectric layer 434. As a result, multiple openings that are used to contain conductive features are formed in the dielectric layer 434. One or more conductive materials are then deposited over the dielectric layer 434 to overfill these openings. A planarization process is then used to remove the portions of the conductive materials that are outside of the openings. As a result, the remaining portions of the conductive materials form the conductive features 436, as shown in FIG. 4B.

The conductive materials may be made of or include copper, aluminum, cobalt, tungsten, nickel, gold, platinum, one or more other suitable materials, or a combination thereof. The conductive materials may be deposited using a CVD process, an electroplating process, an electrochemical plating process, an ALD process, a PVD process, another applicable process, or a combination thereof. The planarization process may include a CMP process, a grinding process, a dry polishing process, an etching process, another applicable process, or a combination thereof. Due to the planarization process, the chip structure 40 may have a highly planarized bonding surface.

As shown in FIG. 4B, the chip structure 40 is bonded to the chip structure 10A through direct bonding, in accordance with some embodiments. The direct bonding may be achieved using a hybrid bonding, a fusion bonding, or the like. The hybrid bonding may include metal-to-metal bonding such as the bonding between the conductive features 308 and 436 and dielectric-to-dielectric bonding such as the bonding between the dielectric layers 306 and 434. In some embodiments, there is no solder elements formed between the chip structures 10A and 40.

In some embodiments, the chip structure 40 is placed directly on the chip structure 10A. As a result, the dielectric layers 306 and 434 are in direct contact with each other and bonded to each other. The conductive features 308 and 436 are also in direct contact with each other.

In some embodiments, before the placing of the chip structure 40, planarization processes are performed, so as to provide highly planarized bonding surfaces of the chip structures 10A and 40. In some embodiments, there is no gap between the dielectric layers 306 and 434. In some embodiments, there is no gap between the conductive features 308 and 436. In some embodiments, a thermal operation is then used to enhance the bonding between the conductive features 308 and 436. The temperature of the thermal operation may within a range from about 100 degrees C. to about 700 degrees C.

Figure 4C:
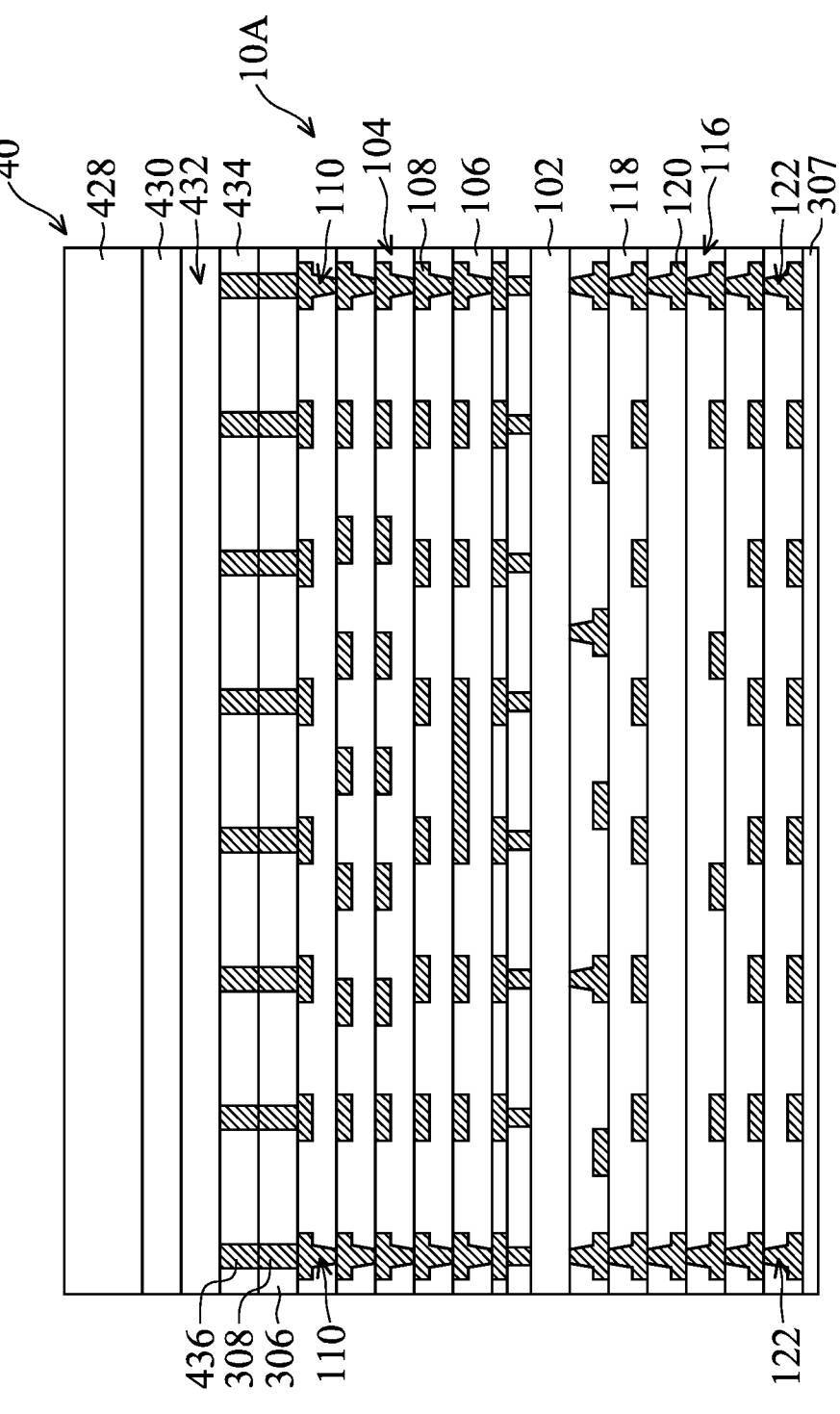

As shown in FIG. 4C, the carrier substrate 302 and the adhesive film 304 are removed, in accordance with some embodiments. As a result, the protective layer 307 is exposed.

Figure 4D:
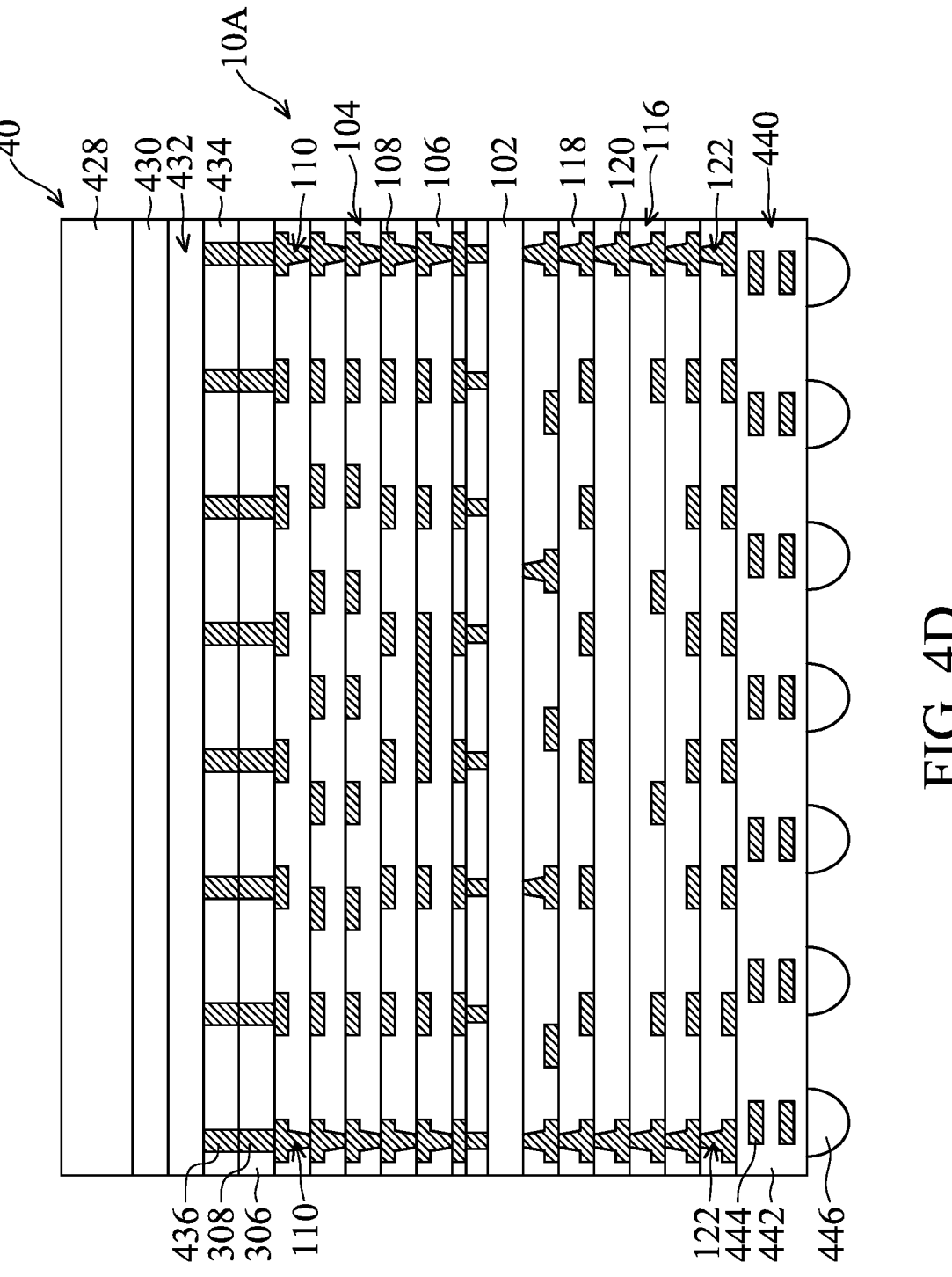

As shown in FIG. 4D, the protective layer 307 is then removed, in accordance with some embodiments. As a result, the via tower structures 122 and some of the conductive features 120 of the back-side interconnection structure 116 are exposed. The protective layer 307 may be removed using a CMP process, a grinding process, an etching process, another applicable process, or a combination thereof.

Afterwards, a redistribution structure 440 and conductive bumps 446 are then formed on the back-side interconnection structure 116 of the chip structure 10A, as shown in FIG. 4D in accordance with some embodiments. The redistribution structure 440 may include multiple insulating layers 442 and multiple conductive features 444. The conductive features 444 may be used to provide electrical connections between the conductive bumps 446 and the back-side interconnection structure 116.

In some embodiments, the insulating layers 442 are made of or include silicon oxide, carbon-containing silicon oxide, silicon oxynitride, carbon-containing silicon oxynitride, polyimide, polybenzoxazole (PBO), one or more other suitable materials, or a combination thereof.

The conductive features 444 may include conductive line and conductive vias. The conductive features 444 may be made of or include copper, cobalt, aluminum, gold, one or more other suitable materials, or a combination thereof. The formation of the redistribution structure 440 may involve multiple deposition processes, multiple patterning processes, and multiple planarization processes.

The conductive bumps 446 may include a solder material. The solder material may be a tin-containing material. The tin-containing material may further include copper, silver, gold, aluminum, lead, one or more other suitable materials, or a combination thereof. In some other embodiments, the solder material is lead-free.

In some embodiments, there is no conductive via formed in the chip structure 10A to completely penetrate through the device portion 102 of the chip structure 10A. In some embodiments, there is no through chip via or through substrate via formed in the chip structure 40. The chip structure 40 may communicate with the chip structure 10A through the via tower structures 110. The device elements formed in the chip structures 10A and 40 may be electrically connected to the conductive bumps 446 through the via tower structures 122 and 110. In some embodiments, because the chip structures 10A and 40 have no through substrate vias formed therein, it is not necessary to define keep out zones in the chip structures 10A and 40. More space is thus available for routing. The performance and reliability of the package structure are significantly improved.

In some embodiments, one or more dicing operations are used to separate the bonded chip structures into multiple package structures. In some embodiments, one of the package structures is shown in FIG. 4D. The package structure may function as a system on integrated chips (SoIC) that may further be integrated into a chip on wafer on substrate (CoWoS) package structure, an integrated fan-out (InFO) package structure, or the like. Many variations and/or modifications can be made to embodiments of the disclosure. In some other embodiments, no dicing operation is performed. The entirety of the bonded chip structures forms a single package structure.

Figure 5:
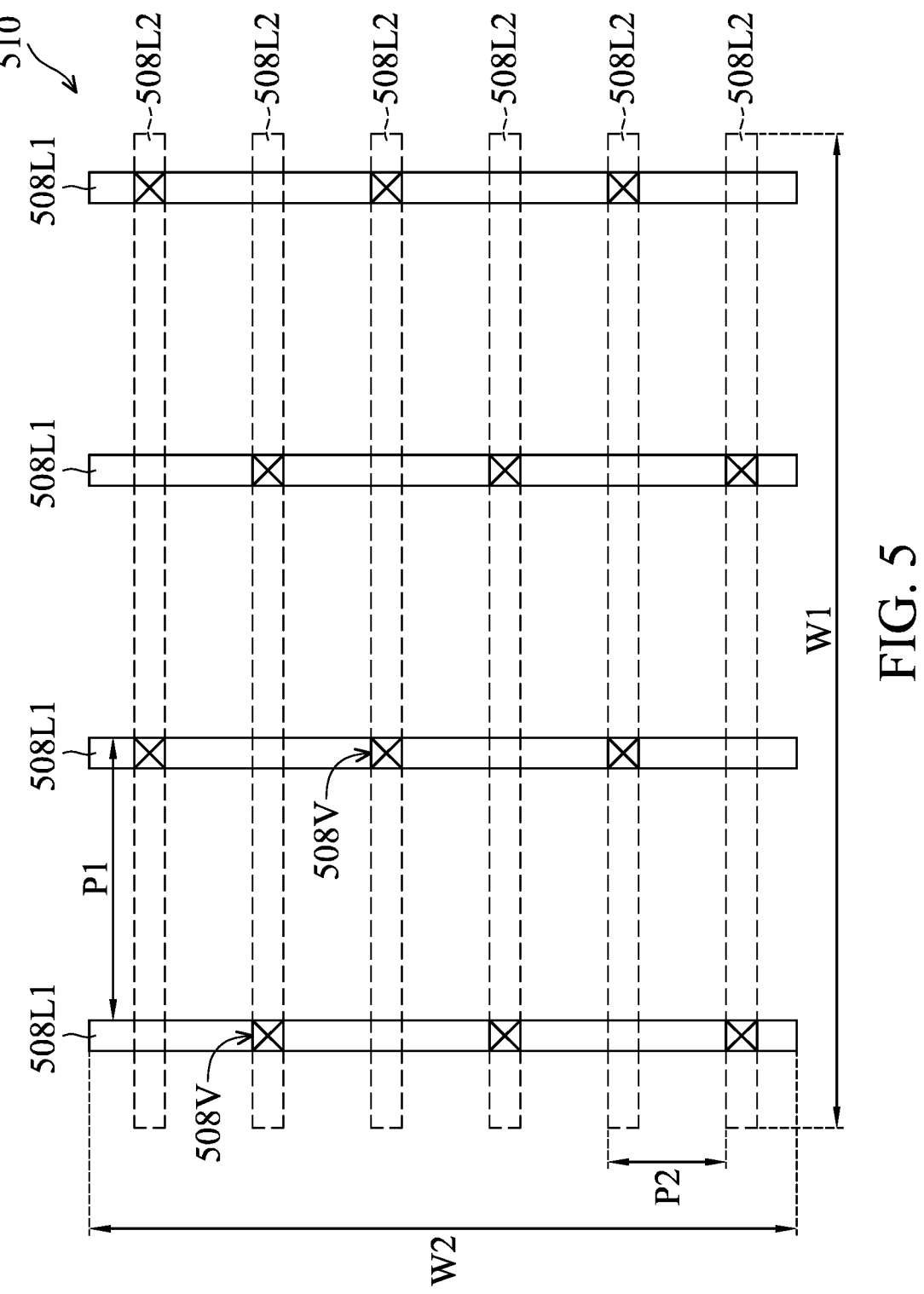
FIG. 5 is a top view of an intermediate stage of a process for forming a package structure, in accordance with some embodiments.

The via tower structures 110 and 122 as illustrated in the embodiments shown in FIGS. 1-4 may have many variations. FIG. 5 is a top view of an intermediate stage of a process for forming a package structure, in accordance with some embodiments. In some embodiments, FIG. 5 shows a top view of a via tower structure 510. The via tower structure 510 may be the same as or similar to one of the via tower structures 110 and 122 as illustrated in the embodiments shown in FIGS. 1-4.

In some embodiments, the via tower structure 510 includes multiple conductive vias 508V, multiple conductive lines 508L1, and multiple conductive lines 508L2. In some embodiments, the conductive lines 508L1 are upper conductive lines, and the conductive lines 508L2 are lower conductive lines. One or more dielectric layers may be formed between the conductive lines 508L1 and 508L2. The conductive lines 508L2 are covered by the dielectric layers and thus illustrated in dotted lines in FIG. 5.

Each of the conductive vias 508V forms electrical connection between a respective upper conductive line and a respective lower conductive line. According to the photolithography ability, the pitch P1 between the conductive lines 508L1 and the pitch P2 between the conductive lines 508L2 may be formed as small as possible. Similarly, the pitch between the conductive vias 508V is also small. More space is thus available for routing.

As shown in FIG. 5, the via tower structure 510 has widths W1 and W2. Each of the widths W1 and W2 may be in a range from about 0.5 μm to about 15 μm. The via tower structure 510 may have a lower resistivity than that of a through chip via or through substrate via. The performance and reliability of package structure that includes the via tower structure may be improved further.

Embodiments of the disclosure form a package structure that includes a stack of multiple chip structures. No through chip via or through substrate via is formed in the stacked chip structures. Multiple via tower structures are formed in the back-side interconnection structure and/or the front-side interconnection structure of the stacked chip structures. The via tower structures formed in the back-side interconnection structure may function as backside power rails. Since there is no through substrate vias formed in the stacked chip structures, it is not necessary to define keep out zones for the through substrate vias. More space is thus available for routing. The performance and reliability of the package structure with the three-dimensional architecture may be greatly improved.

In accordance with some embodiments, a method for forming a package structure is provided. The method includes disposing a first chip structure over a carrier substrate. The first chip structure has a front-side interconnection structure facing the carrier substrate. The method also includes forming a back-side interconnection structure over the first chip structure. The first chip structure has a device portion between the back-side interconnection structure and the front-side interconnection structure. The back-side interconnection structure has stacked conductive vias. The method further includes bonding a second chip structure to the first chip structure using dielectric-to-dielectric bonding and metal-to-metal bonding.

In accordance with some embodiments, a method for forming a package structure is provided. The method includes providing a semiconductor wafer, and the semiconductor wafer has a front-side interconnection structure, a device portion, and a back-side interconnection structure. The device portion is between the front-side interconnection structure and the back-side interconnection structure. The method also includes performing a planarization process on one of the front-side interconnection structure and the back-side interconnection structure. The method further includes bonding a chip structure to one of the front-side interconnection structure and the back-side interconnection structure using dielectric-to-dielectric bonding and metal-to-metal bonding after the planarization process.

In accordance with some embodiments, a package structure is provided. The package structure includes a first chip structure. The first chip structure has a front-side interconnection structure, a device portion, and a back-side interconnection structure, and the device portion is between the front-side interconnection structure and the back-side interconnection structure. The package structure also includes a stack of conductive vias formed in the back-side interconnection structure. The package structure further includes a second chip structure directly bonded to one of the front-side interconnection structure and the back-side interconnection structure using dielectric-to-dielectric bonding and metal-to-metal bonding.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a package structure, comprising:
disposing a first chip structure over a carrier substrate, wherein the first chip structure has a front-side interconnection structure facing the carrier substrate;
forming a back-side interconnection structure over the first chip structure, wherein the first chip structure has a device portion between the back-side interconnection structure and the front-side interconnection structure, and the back-side interconnection structure has stacked conductive vias;
bonding a second chip structure to the first chip structure using dielectric-to-dielectric bonding and metal-to-metal bonding, wherein the second chip structure is directly bonded to the front-side interconnection structure using dielectric-to-dielectric bonding and metal-to-metal bonding;
attaching a second carrier substrate to the back-side interconnection structure; and
removing the carrier substrate to expose the front-side interconnection structure before the second chip structure is bonded.

2. The method for forming a package structure as claimed in claim 1, further comprising:
directly bonding a third chip structure to the first chip structure using dielectric-to-dielectric bonding and metal-to-metal bonding, wherein bottommost surfaces of the third chip structure and the second chip structure are substantially level.

3. The method for forming a package structure as claimed in claim 2, wherein the third chip structure and the second chip structure are laterally spaced apart from each other.

4. The method for forming a package structure as claimed in claim 2, wherein a first distance between the first chip structure and the second chip structure is substantially equal to a second distance between the first chip structure and the third chip structure.

5. The method for forming a package structure as claimed in claim 1, further comprising:
removing the second carrier substrate to expose the back-side interconnection structure;
forming a redistribution structure on the back-side interconnection structure; and
forming conductive bumps over the redistribution structure.

6. The method for forming a package structure as claimed in claim 1, wherein the first chip structure is wider than the second chip structure.

7. The method for forming a package structure as claimed in claim 1, wherein the first chip structure is substantially as wide as the second chip structure.

8. The method for forming a package structure as claimed in claim 7, wherein the second chip structure is a semiconductor wafer.

9. The method for forming a package structure as claimed in claim 1, wherein the front-side interconnection structure is as wide as the back-side interconnection structure.

10. The method for forming a package structure as claimed in claim 9, wherein the front-side interconnection structure is formed after the device portion.

11. A method for forming a package structure, comprising:
providing a semiconductor wafer, wherein the semiconductor wafer has a front-side interconnection structure, a device portion, and a back-side interconnection structure, the device portion is formed before the front-side interconnection structure is formed, and the device portion is between the front-side interconnection structure and the back-side interconnection structure;
performing a planarization process on one of the front-side interconnection structure and the back-side interconnection structure; and
bonding a chip structure to one of the front-side interconnection structure and the back-side interconnection structure using dielectric-to-dielectric bonding and metal-to-metal bonding after the planarization process.

12. The method for forming a package structure as claimed in claim 11, further comprising:
bonding a second chip structure to one of the front-side interconnection structure and the back-side interconnection structure using dielectric-to-dielectric bonding and metal-to-metal bonding, wherein bottommost surfaces of the chip structure and the second chip structure are substantially level; and
forming a dielectric layer laterally surrounding the chip structure and the second chip structure.

13. The method for forming a package structure as claimed in claim 11, wherein the chip structure is substantially as wide as the semiconductor wafer.

14. The method for forming a package structure as claimed in claim 11, further comprising:
forming a plurality of conductive vias in the back-side interconnection structure, wherein the conductive vias together form a via tower structure.

15. The method for forming a package structure as claimed in claim 11, wherein no conductive via completely penetrating through the device portion of the semiconductor wafer is formed.

16. A method for forming a package structure, comprising:
providing a first chip-containing structure, wherein the first chip-containing structure has a front-side interconnection structure, a device portion, and a back-side interconnection structure, the device portion is between the front-side interconnection structure and the back-side interconnection structure, the front-side interconnection structure has a via tower structure having a stack of a plurality of conductive vias, and each of the conductive vias is thinner than the front-side interconnection structure;
performing a planarization process on one of the front-side interconnection structure and the back-side interconnection structure; and
bonding a second chip-containing structure to one of the front-side interconnection structure and the back-side interconnection structure using dielectric-to-dielectric bonding and metal-to-metal bonding after the planarization process.

17. The method for forming a package structure as claimed in claim 16, wherein the back-side interconnection structure has second stacked conductive vias.

18. The method for forming a package structure as claimed in claim 16, wherein the first chip-containing structure is wider than the second chip-containing structure.

19. The method for forming a package structure as claimed in claim 16, further comprising:

forming a protective layer over the first chip-containing structure to laterally surround the second chip-containing structure.

20. The method for forming a package structure as claimed in claim 16, wherein each of the conductive vias gradually shrinks along a direction towards the device portion.

* * * * *